US012284480B2

(12) United States Patent
Giusti et al.

(10) Patent No.: US 12,284,480 B2
(45) Date of Patent: Apr. 22, 2025

(54) TRANSDUCER ASSEMBLY WITH BURIED CAVITIES AND METHOD OF MANUFACTURING THE SAME

(71) Applicant: STMicroelectronics International N.V., Geneva (CH)

(72) Inventors: Domenico Giusti, Caponago (IT); Fabio Quaglia, Pizzale (IT); Marco Ferrera, Concorezzo (IT); Carlo Luigi Prelini, Seveso (IT)

(73) Assignee: STMicroelectronics International N.V., Geneva (CH)

( * ) Notice: Subject to any disclaimer, the term of this patent is extended or adjusted under 35 U.S.C. 154(b) by 134 days.

(21) Appl. No.: 18/066,148

(22) Filed: Dec. 14, 2022

(65) Prior Publication Data

US 2024/0205611 A1    Jun. 20, 2024

(51) Int. Cl.
*H04R 17/00*    (2006.01)
(52) U.S. Cl.
CPC .................................... *H04R 17/00* (2013.01)
(58) Field of Classification Search
CPC .................................................... H04R 17/00
USPC .......................................................... 381/190
See application file for complete search history.

(56) References Cited

U.S. PATENT DOCUMENTS

| 5,260,913 | A | * | 11/1993 | Kadota | .................... | H03H 3/08 |
|---|---|---|---|---|---|---|
| | | | | | | 333/194 |
| 7,294,536 | B2 | | 11/2007 | Villa et al. | | |
| 2008/0261345 | A1 | | 10/2008 | Villa et al. | | |
| 2010/0246862 | A1 | * | 9/2010 | Ihl | .......................... | H04R 17/00 |
| | | | | | | 310/331 |
| 2011/0084570 | A1 | | 4/2011 | Soeda et al. | | |
| 2011/0115333 | A1 | | 5/2011 | Ezaki | | |
| 2013/0115333 | A1 | | 5/2013 | Crosato | | |
| 2013/0285166 | A1 | | 10/2013 | Classen | | |
| 2013/0307096 | A1 | | 11/2013 | Classen et al. | | |
| 2014/0264660 | A1 | | 9/2014 | Rothberg et al. | | |
| 2015/0232329 | A1 | | 8/2015 | Classen | | |
| 2016/0009544 | A1 | | 1/2016 | Rothberg et al. | | |
| 2016/0009549 | A1 | | 1/2016 | Rothberg et al. | | |

(Continued)

FOREIGN PATENT DOCUMENTS

EP    3599217 A1    1/2020

OTHER PUBLICATIONS

Kumar et al., "Robust TSV Via-Middle and Via-Reveal Process Integration Accomplished through Characterization and Management of Sources of Variation," IEEE, pp. 787-793, 2012.

(Continued)

*Primary Examiner* — Suhan Ni
(74) *Attorney, Agent, or Firm* — Seed IP Law Group LLP

(57) ABSTRACT

The present disclosure is directed to transducer assemblies or device in which one or more buried cavities are present within a substrate and define or form one or more membranes along a surface of the substrate. One or more piezoelectric actuators are formed on the one or more membranes and the one or more piezoelectric actuators drive the membranes at an operating frequency with an operating bandwidth of the transducer assemblies. Each of the one or more membranes is anchored at respective portions to a main body portion of the substrate to provide robust and strong anchoring of each of the one or more membranes to push unwanted flexure modes outside the operating bandwidth of the transducer assemblies.

20 Claims, 19 Drawing Sheets

(56) References Cited

U.S. PATENT DOCUMENTS

| | | | |
|---|---|---|---|
| 2016/0057529 A1* | 2/2016 | Kappus | H04R 1/1075 381/74 |
| 2017/0283254 A1 | 10/2017 | Rothberg et al. | |
| 2018/0369862 A1 | 12/2018 | Alie et al. | |
| 2019/0123711 A1* | 4/2019 | Revier | H03H 9/02653 |
| 2020/0024131 A1 | 1/2020 | Quaglia et al. | |
| 2020/0156114 A1 | 5/2020 | Gattere et al. | |
| 2022/0306456 A1 | 9/2022 | Quaglia et al. | |
| 2023/0028024 A1 | 1/2023 | Shaw et al. | |

OTHER PUBLICATIONS

Lee, Hotaik et al., "Design of a Sparse Sub-array for Focused Ultrasound Surgery of Large Tumors," *IEEE International Ultrasonics Symposium Proceedings*, 2012, pp. 1165-1168.

Park, Byoungyoul et al., "A Lorentz Force Actuated Continuous Deformable Polymer Mirror for Wavefront Control," Proceedigns, 1:554, 2017, 4 pages.

\* cited by examiner

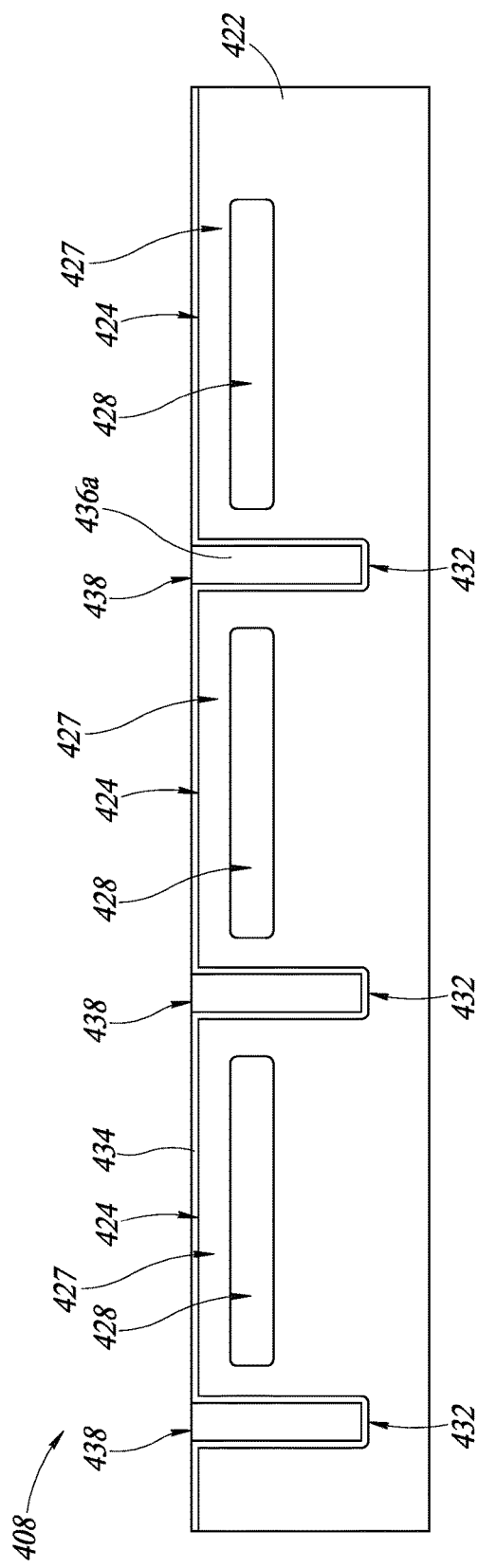
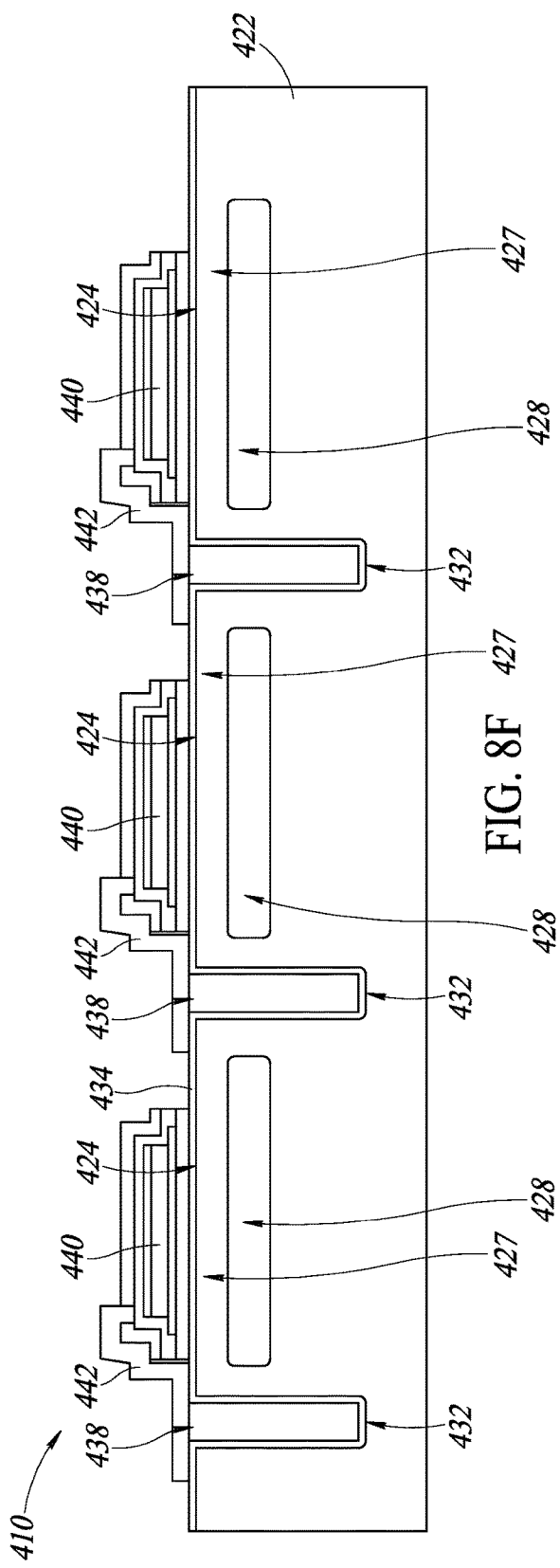
FIG. 8E
FIG. 8F

TRANSDUCER ASSEMBLY WITH BURIED CAVITIES AND METHOD OF MANUFACTURING THE SAME

BACKGROUND

Technical Field

The present disclosure is directed to a transducer assembly including a cavity buried within a substrate as well as a method of forming the transducer assembly including the cavity buried within the substrate.

Description of the Related Art

Conventional transducer die and assemblies generally include an array of piezoelectric actuators that is present within the conventional transducer die and assemblies to generate and propagate a plurality of waves (e.g., acoustic waves such as ultrasonic waves) directed at a target. For example, the plurality of waves may be ultrasonic waves that are directed at a human being to perform an ultrasound procedure to image objects (e.g., a baby, a tumor, or some other point of interest within the human being or target) present within the human being. The array of piezoelectric actuators may be one or more piezoelectric micromachined ultrasound transducers (PMUTs). To generate a more detailed and higher fidelity ultrasonic image, a number of respective piezoelectric actuators in the array of piezoelectric actuators may be increased.

However, the number of respective piezoelectric actuators in the array of piezoelectric actuators of these conventional transducer die and assemblies is generally limited to prevent or avoid flexural modes outside an operating bandwidth of the conventional transducer die and assemblies. For example, avoiding or preventing these flexural modes outside the operating bandwidths results in spacing between adjacent piezoelectric actuators only being minimized to a minimum dimension that may be only allow for the image quality or fidelity to be increased by a minimal amount.

BRIEF SUMMARY

The present disclosure is directed to embodiments of a transducer die or assemblies including an array of piezoelectric actuators that are spaced more closely together relative to the piezoelectric actuators of the conventional transducer die and assemblies to increase image quality and fidelity while avoiding or preventing flexural modes outside an operating bandwidth of the transducer die or assemblies of the present disclosure. The present disclosure is also directed to methods of manufacturing these embodiments of the transducer die and assemblies of piezoelectric actuators that are spaced more closely together relative to the piezoelectric actuators of the conventional transducer die and assemblies.

For example, in at least one embodiment, a transducer assembly includes a substrate with a first surface and a second surface that is opposite to the first surface. A plurality of cavities is within the substrate and is between the first surface and the second surface of the substrate, and the plurality of cavities is closer to the first surface of the substrate than the second surface of the substrate. A plurality of piezoelectric actuators is on the first surface of the substrate, and each respective piezoelectric actuator of the plurality of actuators overlaps and is aligned with a corresponding cavity of the plurality of cavities. In other words, there may be a one-to-one relationship between the plurality of cavities and the plurality of piezoelectric actuators. Each respective cavity of the plurality of cavities is spaced apart from an adjacent respective cavity of the plurality of cavities by a corresponding wall of a plurality of walls of the substrate that is between the first and second surface of the substrate. Each respective wall of the plurality of walls may have a dimension greater than or equal to 5-micrometers (μm) and less than or equal to 20-micrometers (μm). Reducing the dimension of the walls allows a greater number of respective piezoelectric actuators of the plurality of piezoelectric actuators to be included in the transducer assembly. The greater number of piezoelectric actuators increases an operating bandwidth of the transducer assembly and increases detail and fidelity (e.g., increases fidelity factor) of an ultrasonic image captured utilizing the transducer assembly.

BRIEF DESCRIPTION OF THE SEVERAL VIEWS OF THE DRAWINGS

For a better understanding of the present disclosure, some embodiments thereof are now described, purely by way of non-limiting example, with reference to the attached drawings, wherein:

FIGS. 8A-8I are cross-sectional views of respective steps of the embodiment of the method of manufacturing in the flowchart as shown in FIG. 7;

DETAILED DESCRIPTION

Figure 1:
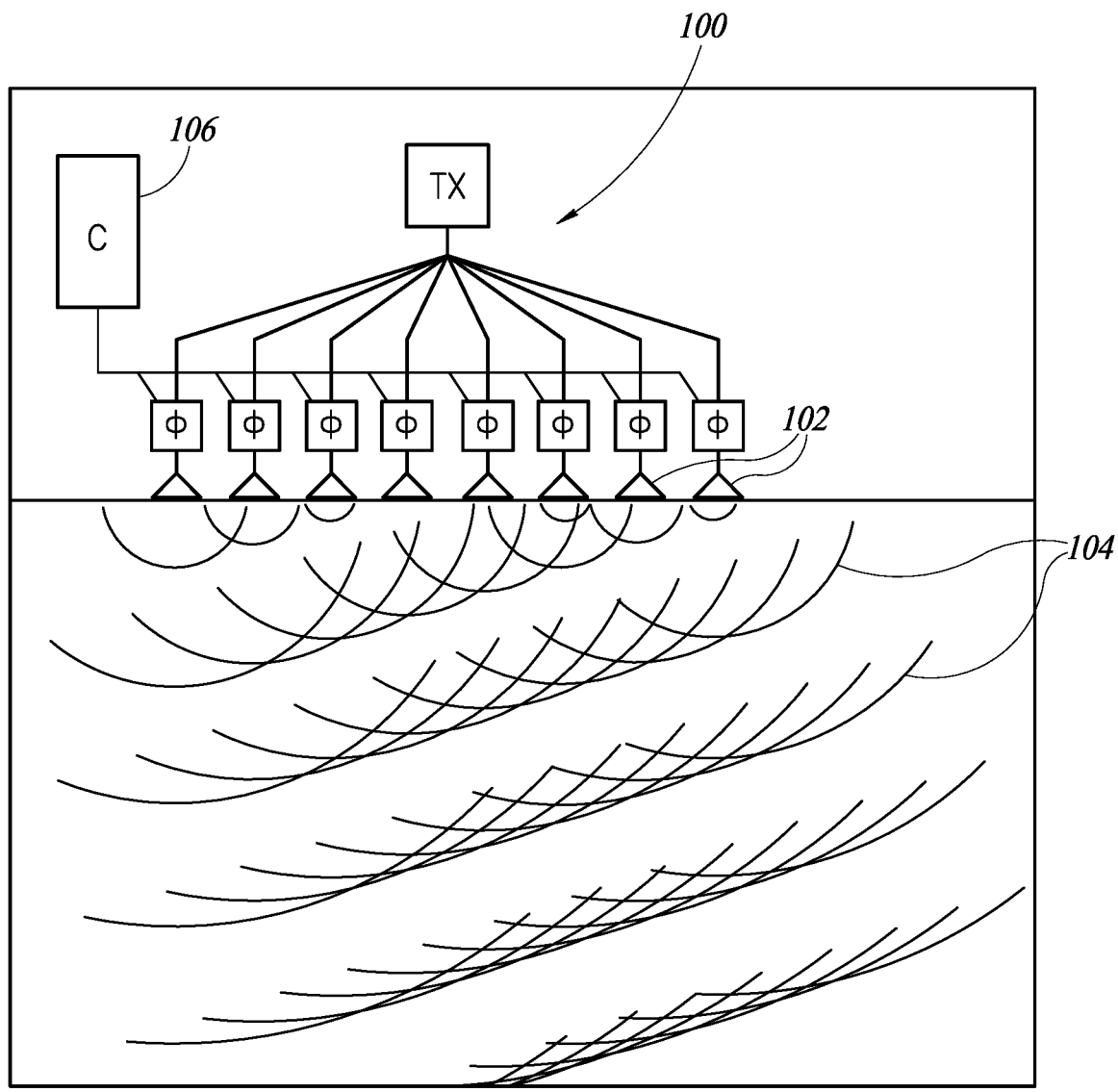
FIG. 1 is a schematic diagram of a plurality of transducers that are configured to generate a plurality of waves.

In the following description, certain specific details are set forth in order to provide a thorough understanding of various embodiments of the disclosure. However, one skilled in the art will understand that the disclosure may be practiced without these specific details. In other instances, well-known structures associated with electronic components and transducers, packages, and semiconductor and transducer fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second, third, etc., does not necessarily imply a ranked sense of order, but rather may only distinguish between multiple instances of an act or a similar structure or material.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms "top," "bottom," "upper," "lower," "left," and "right," are used for only discussion purposes based on the orientation of the components in the discussion of the Figures in the present disclosure as follows. These terms are not limiting as the possible positions explicitly disclosed, implicitly disclosed, or inherently disclosed in the present disclosure.

The term "substantially" is used to clarify that there may be slight differences and variation when a package is manufactured in the real world, as nothing can be made perfectly equal or perfectly the same. In other words, "substantially" means and represents that there may be some slight variation in actual practice and instead is made or manufactured within selected tolerances.

As used in this specification and the appended claims, the singular forms "a," "an," and "the" include plural referents unless the content clearly dictates otherwise.

While various embodiments are shown and described with respect to various transducer assemblies, it will be readily appreciated that the embodiments of the present disclosure are not limited thereto. In various embodiments, the structures, devices, and methods and the like described herein may be embodied in or otherwise utilized in any suitable type or form of semiconductor or transducer assembly, and may be manufactured utilizing any suitable semiconductor or transducer assembly and packaging technologies.

The present disclosure is directed to various embodiments of transducer assemblies that have a greater number of piezoelectric actuators to increase fidelity and detail (e.g., increased fidelity factor) of a captured image (e.g., an ultrasonic image captured utilizing ultrasonic waves generated by the piezoelectric actuators) utilizing the various embodiments of the transducer assemblies. The various embodiments of the transducer assemblies of the present disclosure have an increased operating bandwidth and any unwanted or undesired flexure modes (e.g., resonance mode) of membranes of the various embodiments of the transducer assemblies are outside the increased operating bandwidth as the membranes are fixed. In other words, the various embodiments of the transducer assemblies of the present disclosure have an increased fidelity factor due to an increase in the number of piezoelectric actuators of the plurality of piezoelectric actuators and have an increased operating bandwidth due to unwanted or undesired flexure modes during operation being outside the increased operating bandwidth due to the membranes being fixed.

For example, at least one embodiment of a transducer assembly of the present disclosure includes a substrate having a first surface and a second surface opposite to the first surface. A plurality of buried cavities is buried within the substrate between the first surface and the second surface, and the plurality of buried cavities is closer to the first surface of the substrate than the second surface of the substrate. A plurality of piezoelectric actuators is on the first surface of the substrate, and each respective piezoelectric actuator of the plurality of piezoelectric actuators overlaps a corresponding buried cavity of the plurality of buried cavities such that there is a one-to-one relationship between the plurality of piezoelectric actuators and the plurality of buried cavities. A plurality of membranes of the substrate is between each corresponding buried cavity of the plurality of buried cavities and each corresponding piezoelectric actuator of the plurality of actuators. Each respective piezoelectric actuator of the plurality of piezoelectric actuators extends away from the first surface of the substrate and extends away from buried cavity. A plurality of electrical pathways extends through the substrate from the first surface to the second surface, and each respective electrical pathway is coupled to a corresponding piezoelectric actuator of the plurality of piezoelectric actuators such that control and data signals may be transmitted to and from the plurality of piezoelectric actuators through the plurality of electrical pathways. The electrical pathways of the transducer assembly may be coupled to an application-specific integrated circuit (ASIC) assembly that includes a plurality of ASIC die for receiving data signals from the plurality of piezoelectric actuators while transmitting control signals to the plurality of piezoelectric actuators through the electrical pathways.

In view of the discussion herein, the present disclosure is directed to increasing the performance of those embodiments, in particular as regards amplification of the echo (e.g., wave reflected off an object being imaged or captured), the transducers, typically formed by corresponding MEMS devices are arranged according to a matrix, to be arranged as close as possible to the electronic circuitry, and in particular to the part of electronic circuitry having the function of amplifying the electrical signals generated by the transducers. However, this need clashes against the high number of transducers (of the order of thousands) that are typically used. In practice, since in some embodiments each transducer is coupled to a respective ASIC (Application-Specific Integrated Circuit), which forms the driving circuit and the receiver associated to the transducer, it is necessary to manage thousands of connections present between the transducers and the ASICs connected thereto, controlling the delays introduced by the different channels (each channel being understood as being formed by a transducer, by the corresponding driving circuit, and by the corresponding receiver), as well as the jitter present between the various channels. For example, the embodiment of the present disclosure allows for the number of the plurality of transducers to be significantly increased to amplify the echo while providing many (e.g., thousands) connections present between the plurality of transducers and ASICs as well as preventing jitter or cross-communication between the transducers and these channels.

FIG. 1 is directed to a schematic diagram of a transducer assembly 100 including a plurality of piezoelectric actuators 102 generating a plurality of waves 104, for example, when performing an ultrasound on a target such as a human being to capture ultrasound images of a baby within the human being, a tumor within the human being, or some other type of object present within the human being that is not readily visible. A controller/processor 106 is in electrical communication with the plurality of piezoelectric actuators 102 and provides control signals to the plurality of piezoelectric actuators 102 to generate the plurality of waves 104, which are, for example, ultrasonic waves. As the ultrasonic waves 104 move outward and away from the transducer assembly 100, the ultrasonic waves 104 overlap more and more with each other as shown in FIG. 1. The ultrasonic waves 104 then echo or bounce off a target (e.g., a baby or a tumor), and the echo (e.g., waves that have bounced off the target and move away from the target back towards and to the plurality of piezoelectric actuators 102) are sensed by the plurality of piezoelectric actuators 102. The sensing of the echoed waves that were previously the waves 104 generated by the plurality of piezoelectric actuators 102, results in the plurality of piezoelectric actuator generating data signals that are transmitted to the controller/processor 106, and the controller/processer 106 may process those data signals to generate an ultrasound image of the target.

The fidelity or detail of the ultrasound image captured by sensing the echo waves with the plurality of piezoelectric actuators 102 may be referred to as a fidelity factor of the ultrasound image. The fidelity factor can be increased by providing a greater number of the plurality of piezoelectric actuators 102. For example, the eight piezoelectric actuators of the plurality of piezoelectric actuators 102 may be utilized to generate a first ultrasound image with a first fidelity factor, however, if there were two more piezoelectric actuators present for a total of ten piezoelectric actuators, a second ultrasound image could be captured with a second fidelity factor greater than the first fidelity factor. In other words, as the number of the plurality of piezoelectric actuators 102 is increased, the resolution or fidelity factor of captured ultrasound images of the target may be increased providing a more detailed ultrasound image. For example, as the number of the plurality of piezoelectric actuators is increased, an echo or reflected waves that bounced off an object back towards the plurality of piezoelectric actuators is increased in number, strength, or both as there are a greater number of waves that were previously output by the greater number of piezoelectric actuators at the object. In other words, a greater number of pixels may be generated when a greater number of the plurality of piezoelectric actuators are present as a greater number of echoed waves may be captured providing greater fidelity or detail in the captured ultrasound image.

In view of this above discussion, the present disclosure is directed to various embodiments of transducer assemblies in which the number of piezoelectric actuators is increased relative to conventional transducer assemblies. This increase in the number of piezoelectric actuators in the various embodiments of the transducer assemblies of the present disclosure results in these transducer assemblies being capable of capturing ultrasound images with higher fidelity factor than those conventional transducer assemblies in which the number of the plurality of piezoelectric actuators is limited.

Figure 2:
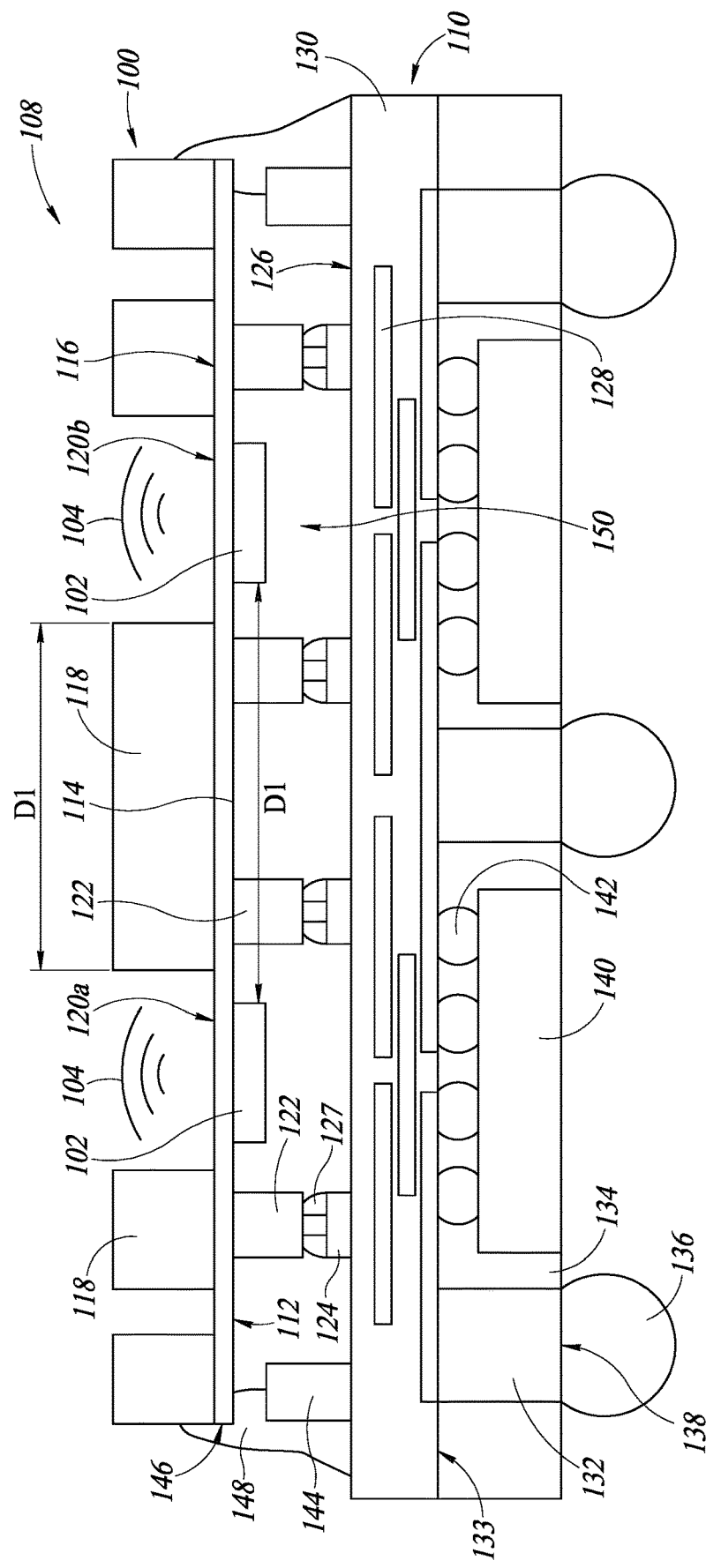
FIG. 2 is a cross-sectional view of an assembly including a transducer assembly with a plurality of piezoelectric actuators being coupled to a suspended membrane of the transducer assembly, and the transducer assembly being coupled to an application-specific integrated circuit (ASIC) assembly.

FIG. 2 is a cross-sectional view of an assembly 108 that includes a more detailed view of the transducer assembly 100 on and coupled to an application-specific integrated circuit (ASIC) assembly 110. The transducer assembly 100 includes the plurality of piezoelectric actuators 102 that generate the waves 104 and detect echoes of the waves 104 that are reflected off the target as discussed earlier herein. The piezoelectric actuators 102 are coupled to an inner surface 112 of a suspended membrane 114, and the inner surface 112 is opposite to an outer surface 116 of the suspended membrane 114. A plurality of semiconductor portions 118 are present on the outer surface 116 of the suspended membrane 114 to assist in fixing the suspended membrane 114 at the points at which the respective semiconductor portions of the plurality of semiconductor portions 118 are present. This allows for the waves 104 to be generated at regions 120a, 120b along the suspended membrane 114 at which the respective piezoelectric actuators 102 are present as the suspended membrane 114 does not move at locations at which the semiconductor portions 118 are present even when the piezoelectric actuators 102 are driven and actuated to generate the waves 104.

The suspended membrane 114 is suspended over the ASIC assembly 110 by a plurality of first conductive structures 122 that extend from the inner surface 112 of the suspended membrane 114. The plurality of first conductive structures 122 is coupled to a plurality of contacts 124 at an inner surface 126 of the ASIC assembly 110 by a solder material 127. The plurality of contacts 124 is coupled to a plurality of conductive traces and vias 128 present within a connection substrate 130 of the ASIC assembly 110. The inner surface 126 is a respective surface of the connection substrate 130. A plurality of second conductive structures 132 extends from an outer surface 133 of the connection substrate 130 opposite to the inner surface 126 of the connection substrate 130. The plurality of second conductive structures 132 is within a non-conductive material 134, and the non-conductive material 134 covers respective sidewalls of the plurality of second conductive structures 132. The non-conductive material 134 may be a molding compound, a resin, an epoxy, or some other similar or like type of non-conductive material through which the plurality of the second conductive structures 132 extends through to the connection substrate 130. A plurality of first solder balls 136 is coupled to end surfaces 138 of the plurality of second conductive structures 132. The end surfaces 138 are exposed from the non-conductive material 134 such that the plurality of first solder balls 136 may be coupled to the end surfaces 138 of the plurality of second conductive structures 132. A plurality of ASIC die 140 is present within the non-conductive material 134 and is between respective second conductive structures 132 of the plurality of second conductive structures 132. The plurality of ASIC die 140 is coupled to the plurality of conductive traces and vias 128 in the connection substrate 130 by a plurality of second solder balls 142.

A plurality of anchoring structures 144 protrudes and extends outward from the inner surface 126 of the connection substrate 130. The plurality of anchoring structures 144 is coupled to respective ends 146 of the suspended membrane 114 by a support material 148. In some embodiments, the support material 148 may be an adhesive, a resin, an epoxy, a molding compound, or some other similar or like type of non-conductive material for coupling the ends 146 of the suspended membrane 114 to the anchoring structures 144.

A cavity 150 is delimited by the inner surface of the suspended membrane 114, the inner surface 126 of the connection substrate 130, the anchoring structures 144, and the support material 148, respectively. The cavity 150 provides enough clearance and space such that the plurality of piezoelectric actuators 102 may be actuated to move the suspended membrane 114 at the regions 120a, 120b to generate the waves 104 and receive echoes of the waves 104 reflected off the target as discussed earlier herein.

The assembly 108 as shown in FIG. 2 may have an operating bandwidth that only allows for operating frequencies up to 4-megahertz (MHz) due to unwanted or undesired flexure modes (e.g., resonance modes) that may occur when trying to operate the assembly 108 at frequencies greater than 4-MHz. For example, the suspended membrane 114 may limit the operating bandwidth of the assembly to frequencies only up to 4-Mhz as unwanted flexure modes that generate noise within a captured image may occur or have a high likelihood of occurring when trying to operate the assembly 108 at a frequency greater than 4-MHz. For example, these flexure modes may be resonance or run away flexure modes in which the regions 120a, 120b of the suspended membrane 114 may move in an uncontrolled or undesired manner due the suspended membrane 114 not being strongly affixed in place by the plurality of semiconductor portions 118 and due to the thinness of the suspended membrane 114. When this unwanted flexure mode occurs, noise generally occurs in the captured ultrasound such that the noisy captured ultrasound has a low resolution and a low fidelity (e.g., a low fidelity factor). In other words, the suspended membrane 114 being suspended and being relatively thin limits the overall operating bandwidth of the assembly 108 such that the assembly 108 cannot be operated at a frequency greater than 4-MHz.

The assembly 108 as shown in FIG. 2 may be limited in the number of piezoelectric actuators 102 that may be provided within the transducer assembly 100 due to a first distance D1 between the regions 120a, 120b having to be large enough to provide proper clearance between the regions 120a, 120b. For example, if the regions 120a, 120b were too close and not spaced apart enough, there may be a high likelihood of unwanted flexure modes that could occur or a high increase in issues with generating the waves 104. The first distance D1 being relatively large to provide proper clearance results between the regions 120a, 120b in the footprint of the transducer assembly 100 increasing significantly and quickly as the number of piezoelectric actuators 102 is increased. This significant and quick increase in the footprint of the transducer assembly 100 when increasing the number of the piezoelectric actuators 102 generally occurs as there is generally not enough available space within an ultrasound device or electronic component to receive the larger transducer assembly 100 with an increased number of the piezoelectric actuators as the footprint of the larger transducer assembly 100 with the greater number of piezoelectric actuators is too large.

In view of the above discussion with respect to the limited operating bandwidth and the limited number of the piezoelectric actuators 102 of the assembly 108, the present disclosure is directed to providing various embodiments of transducer assemblies with an increased number of piezoelectric actuators and an increased operating bandwidth relative to the assembly 108 as shown in FIG. 2. For example, the various embodiments of the transducer assemblies of the present disclosure may have an increased number of piezoelectric actuators relative to the assembly 108 due to the presence of buried cavities within a substrate to form membranes that are actuated by piezoelectric actuators for generating waves. For example, the various embodiment of the transducer assemblies of the present disclosure may have an increased operating bandwidth relative to the assembly 108 due to the membranes formed by the buried cavities being more strongly affixed in place relative to the regions 120a, 120b of the suspended membrane 114 of the assembly 108. The details of the various embodiments of the transducer assemblies having a greater number of piezoelectric actuator resulting in an increase in fidelity factor relative to the assembly 108 and having a larger operating bandwidth range relative to the assembly 108 will be discussed in greater detail as follows herein with respect to FIGS. 3, 4, 5, 6A, 6B, 7, 8A-8I, 9, and 10A-10D.

Figure 3:
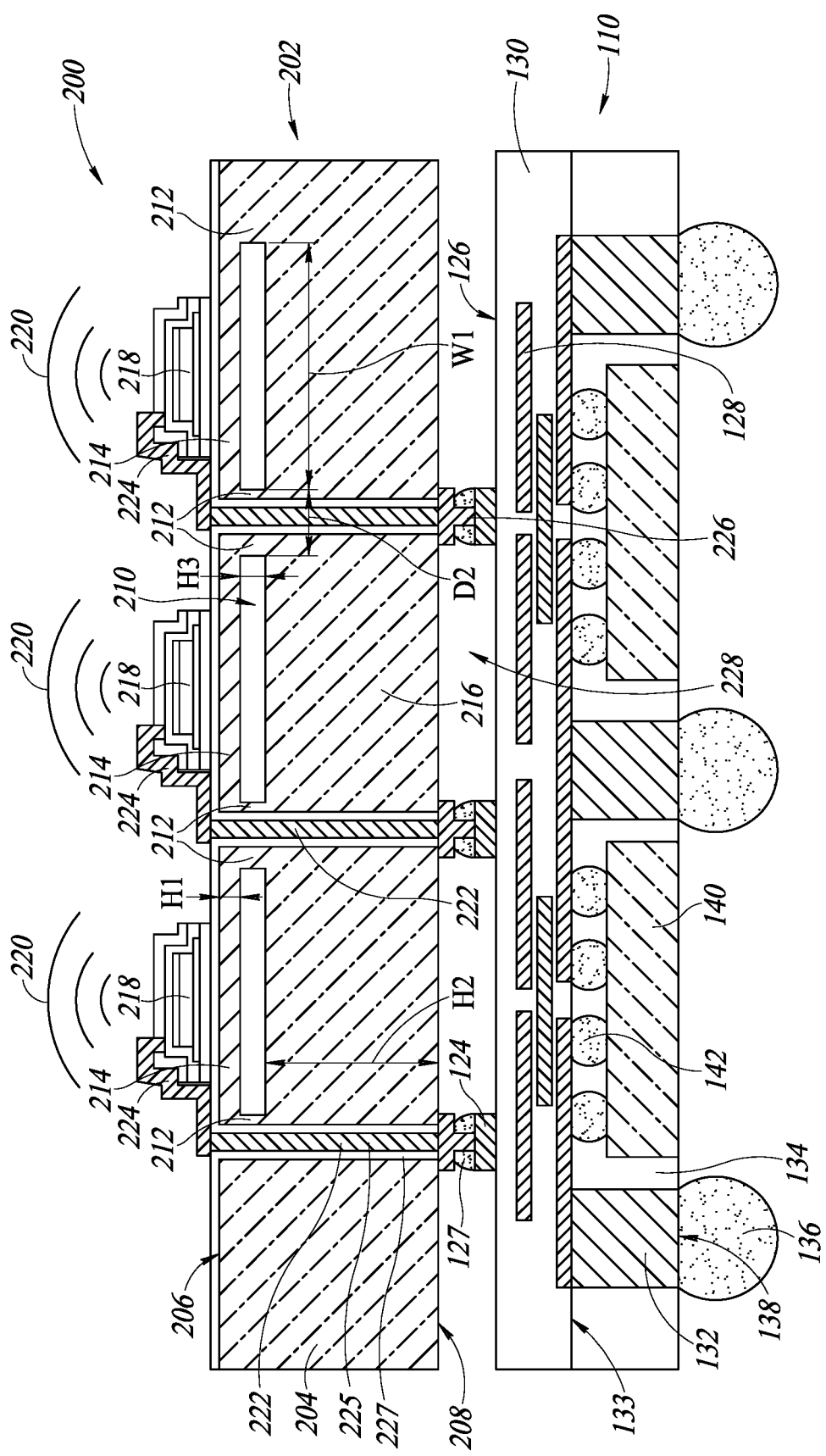
FIG. 3 is a cross-sectional view of an embodiment of a transducer assembly of the present disclosure.

FIG. 3 is a cross-sectional view of an embodiment of an assembly 200 including a transducer assembly 202 and the ASIC assembly 110. For the sake of simplicity and brevity of the present disclosure, the details of the ASIC assembly 110 are not reproduced herein as the details of the ASIC assembly 110 were previously described earlier herein with respect to FIG. 2.

The transducer assembly 202 includes a substrate 204, which may be made of silicon material or silicon-based material. The substrate 204 includes a first surface 206 and a second surface 208 that is opposite to the first surface 206. The first surface 206 may be referred to as an outer surface and the second surface 208 may be referred to as an inner surface. The substrate 204 may be a monolithic substrate or may be a multilayer substrate.

A plurality of cavities 210 is buried and within the substrate 204. The plurality of cavities 210 may be referred to as buried cavities. The plurality of cavities 210 is affixed in place by a plurality of portions 212 that is adjacent to and delimits ends of the plurality of cavities 210. The plurality of cavities 210 is closer to the first surface 206 than the second surface 208. The plurality of cavities is at a first height H1 from the first surface 206 and a second height H2 from the second surface 208. The first height H1 and the second height H2 extend in a direction transverse to the first surface 206 and the second surface 208. The first height H1 is less than the second height H2. Each respective cavity 210 of the plurality of cavities 210 has a width W1 that extends between opposite ends of each respective cavity 210 of the plurality of cavities 210. Each respective cavity 210 of the plurality of cavities 210 has a third height H3 that extends from upper ends to lower ends of each respective cavity 210 of the plurality of cavities 210 based on the orientation of the assembly 200 as shown in FIG. 3. The sum of the first height H1, the second height H2, and the third height H3 is equal to an overall height of the substrate that extends from the first surface 206 to the second surface 208.

The first height H1 may be equal to 2-micrometers (μm), and may be greater than 2-micrometers (μm). The second height H2 may be equal to 145-micrometers (μm), and may be less than or equal to 145-micrometers (μm). The third height H3 may be equal to 3-micrometers (μm), and may be greater than 3-micrometers (μm). The plurality of piezoelectric actuators 218 may have a thickness of 2-micrometers (μm), or may be greater than 2-micrometers (μm). The summation of H1, H2, and H3 may be equal to 150-micrometers (μm), or may be greater than or equal to 150-micrometers (μm).

A plurality of membranes 214 overlaps the plurality of cavities 210. In other words, a respective membrane 214 of the plurality of membranes 214 overlaps a corresponding cavity 210 of the plurality of cavities 210 such that there is a one-to-one relationship between the plurality of membranes 214 and the plurality of cavities 210. The respective membranes 214 of the plurality of membranes 214 each has the first height H1 and the width W1 (e.g., the width W1 may be a diameter of the membranes 214 and the cavities 210, which may be readily seen in FIG. 5 of the present disclosure). Each respective membrane 214 of the plurality of membranes 214 extends between opposite ones of the portions 212 and is affixed at opposite ends by the portions 212 to a main body portion 216 of the substrate 204. The main body portion 216 has the height H2. The portions 212 robustly and strongly affix the respective membranes 214 in place relative to each other and relative to the main body portion 216 of the substrate 204.

A plurality of piezoelectric actuators 218 is on and present at the first surface 206 of the substrate 204. Each respective piezoelectric actuator 218 of the plurality of piezoelectric actuators 218 is present on a corresponding membrane 214 of the plurality of membranes 214 such that there is a one-to-one relationship between the plurality of piezoelectric actuators 218, the plurality of membranes 214, and the plurality of cavities 210. The plurality of piezoelectric actuators 218 is configured to be driven and to actuate the plurality of membranes 214 to generate a plurality of waves 220. As the plurality of membranes 214 is affixed robustly and strongly in place by the portions 212 of the substrate 204, a second distance D2 extends between adjacent ends of adjacent cavities 210 of the plurality of cavities 210 and the second distance D2 is less than the first distance D1. The summation of the distance D2 and the width W1 may be referred to as a pitch. By minimizing the pitch (e.g., summation of the distance D2 and W1), a number of the plurality of piezoelectric actuators 218 and a number of the plurality of membranes 214 provided on the first surface 206 of the substrate 204 are capable of being increased. The plurality of piezoelectric actuators 218 and the plurality of membranes have a one-to-one relationship as shown in the embodiment of the transducer assembly 202.

The width W1 may be equal to 89-micrometers (µm), or, in some embodiments, may be greater than or less than 89-micrometers (µm) to either increase or decrease the number of membranes 214. The second distance D2 may be equal to 5-micrometers (µm), or may be greater than 5-micrometers (µm).

Figure 5:
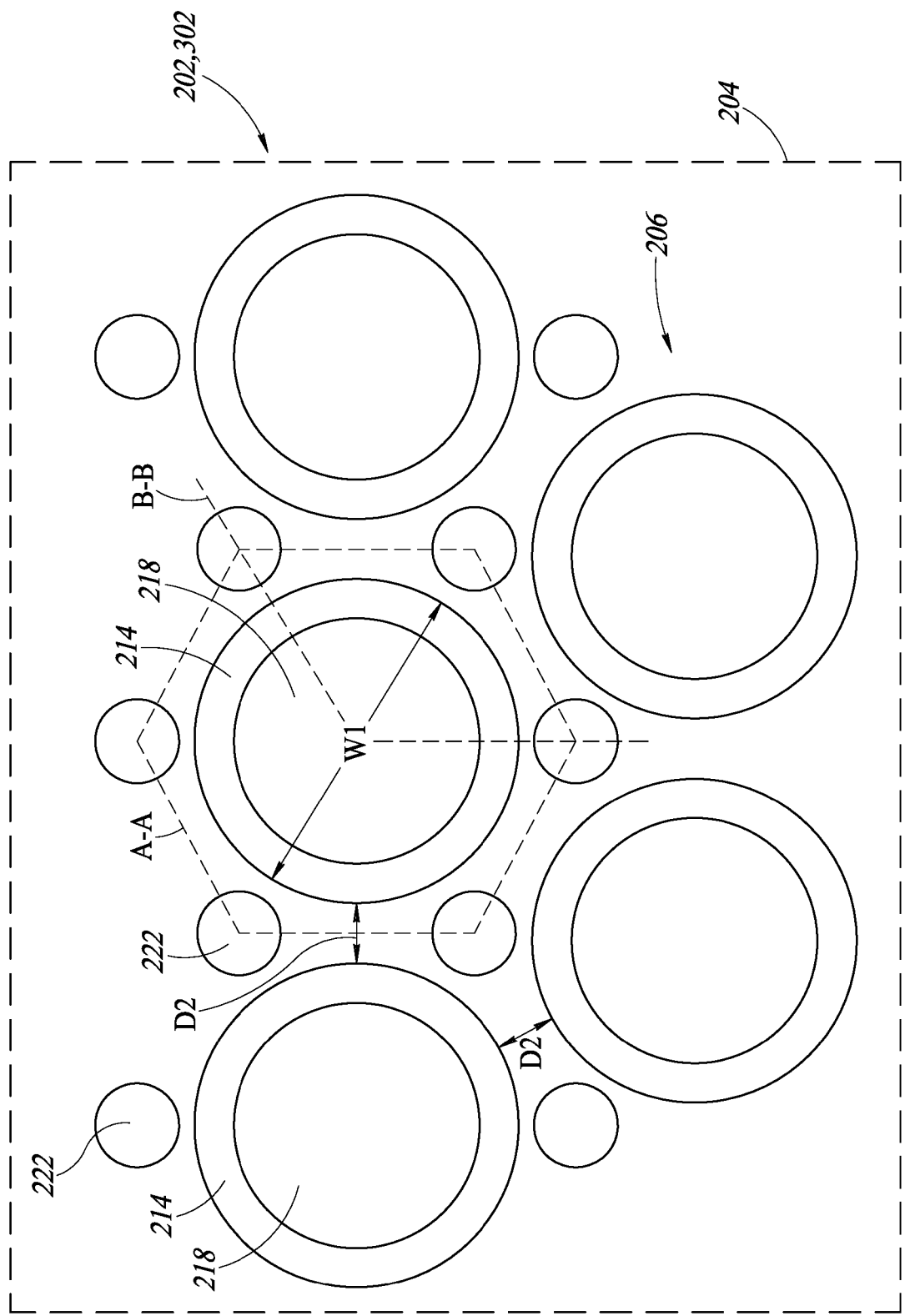
FIG. 5 is a top plan view of a plurality of piezoelectric actuators representative of the plurality of piezoelectric actuators of the embodiments of the transducer assemblies of the present disclosure as shown in FIGS. 3 and 4.

In some embodiments, each respective piezoelectric actuator 218 of the plurality of actuators 218 may be fully within a perimeter of a corresponding membrane 214 of the plurality of membranes 214 (see, e.g., the top plan view of the piezoelectric actuators 218 and the membranes 214 as shown in FIG. 5).

A plurality of electrical pathways 222 extends through the substrate 204 from the first surface 206 to the second surface 208. The plurality of electrical pathways 222 may be through silicon vias (TSVs). The plurality of electrical pathways 222 has first ends at the first surface 206 and second ends at the second surface 208. Each first end of the plurality of electrical pathways 222 is coupled to a corresponding piezoelectric actuator 218 of the plurality of piezoelectric actuators 218 by a respective conductive layer 224 of a plurality of conductive layers 224. The plurality of electrical pathways 222 may include a conductive layer 225, which may be a doped polysilicon layer, and an oxide layer 227, which may be a non-conductive oxide layer 227 that is between the respective conductive layer 225 and the substrate 204.

A plurality of conductive structures 226 is on and present at the second surface 208 of the substrate 204. Each respective conductive structure 226 of the plurality of conductive structures 226 is coupled to a corresponding second end of the second ends of the plurality of electrical pathways 222. Each respective conductive structure 226 of the plurality of conductive structures 226 is coupled to a corresponding contact 124 of the plurality of contacts 124 on and at the inner surface 126 of the connection substrate 130 by the solder material 127. The plurality of conductive structures 226 may be referred to as under bump metallizations (UBMs), contact structures, or some other terminology representative of the plurality of conductive structures 226. A gap 228 is present between the inner surface 126 of the connection substrate 130 and the second surface 208 of the substrate, and the gap 228 extends from the inner surface 126 to the second surface 208.

Figure 4:
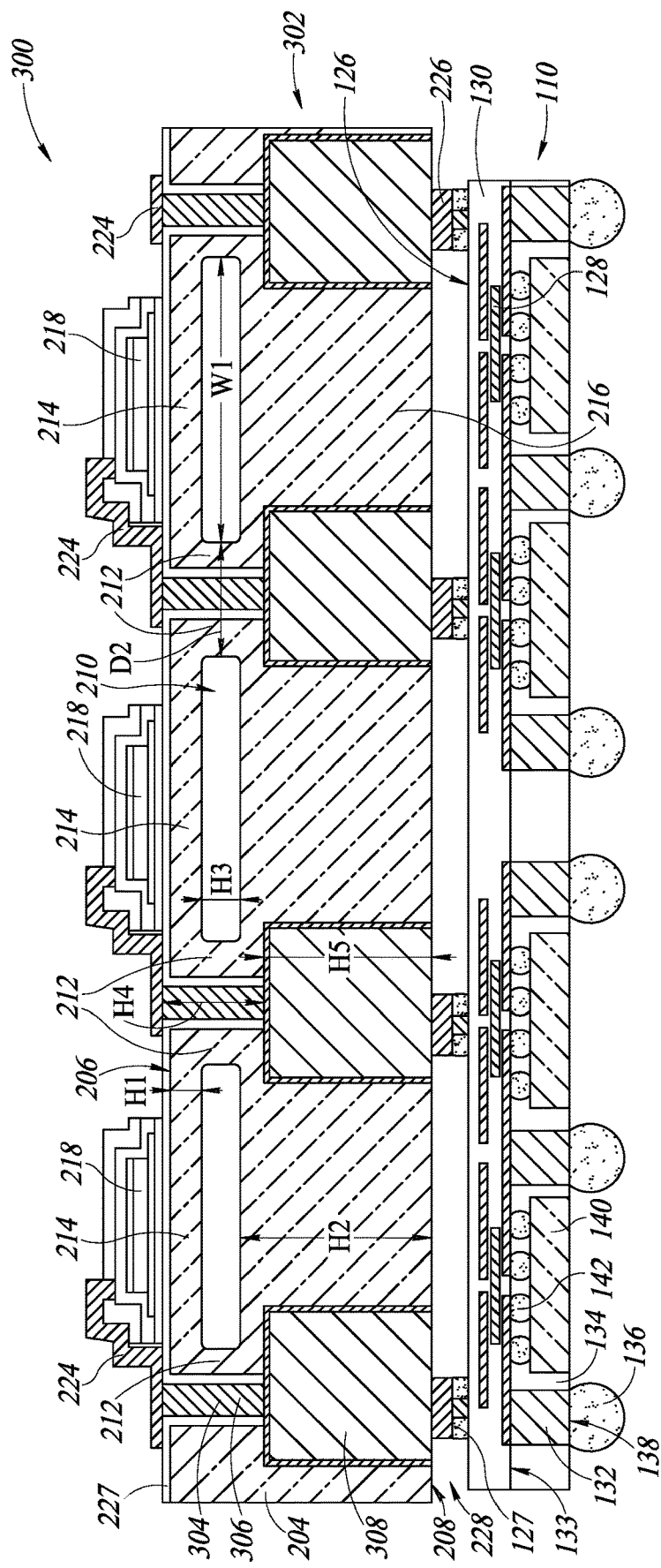
FIG. 4 is a cross-sectional view of an alternative embodiment of a transducer assembly of the present disclosure.

FIG. 4 is a cross-sectional view of an alternative embodiment of an assembly 300, which has several of the same or similar features of the embodiment of the assembly 200. These same or similar features of the assembly 300 relative to the assembly 200 have been provided with the same or similar reference numerals as present in the assembly 200. For the sake of simplicity and brevity of the present disclosure, as these same or similar features in the assembly 300 as the assembly 200 were already discussed in detail with respect to the assembly 200 as shown in FIG. 3, all of those details with respect to those same or similar features are not reproduced herein.

A transducer assembly 302 includes a plurality of electrical pathways 304. The plurality of electrical pathways 304 includes a first portion 306 and a second portion 308. The first portion 306 extends into the first surface 206 of the substrate 204 and terminates within the substrate 204 between the first surface 206 and the second surface 208. The second portion 308 extends into the second surface 208 of the substrate 204 and terminates within the substrate 204 between the first surface 206 and the second surface 208. The first portion 306 and the second portion 308 meet each other and are coupled together at a location between the first surface 206 and the second surface 208 of the substrate 204. This location may be within the main body portion 216 of the substrate 204 such that the first portions 306 of the electrical pathways 304 extend further into the substrate 204 from the first surface 206 relative to the summation of the first height H1 and the third height H3 such that the first portions 306 extend fully past the plurality of cavities 210 buried within the substrate 204. For example, the first portions 306 have a fourth height H4 that is greater than the summation of the first height H1 and the third height H3, and the second portions have a fifth height H5 that is greater than the fourth height H4.

In view of the above discussion, the plurality of membranes 214 is more readily, strongly, and robustly affixed in place by the portions 212 relative to the single suspended membrane 114 as the single suspended membrane 114 is only affixed in place at opposite ends of the single suspended membrane 114 to the anchoring structures 144 by the support material 148 whereas each respective membrane 214 is individually and directly affixed to the main body portion 216 of the substrate 204 by the portions 212. Furthermore, operation of the assembly 108 with the single suspended membrane 114 is limited to frequencies only up to 4-MHz as the regions 120a, 120b are each along the suspended membrane 114 and are each driven by the respective piezoelectric actuators 102 all of which are coupled to the inner surface 112. The respective piezoelectric actuators 102 all being coupled to the inner surface 112 and driving the regions 120a, 102b, which may be sub-regions along the suspended membrane 114, cause unwanted flexure modes to occur in the single suspended membrane 114 when operating the assembly 108 at frequencies greater than 4-MHz. These unwanted flexure modes may be resonance flexure modes or run away flexure modes in which the suspended membrane 114 may flex and move in an uncontrolled manner. These unwanted flexure modes may occur due to cross-talk or disturbances that occur between the regions 120a, 120b when both are driven at the same time as all of the piezoelectric actuators 102 are coupled to the inner surface 112 of the single suspended membrane 114. However, the respective membranes 214 of the plurality of membranes 214 of the transducer assemblies 202, 302 of the assemblies 200, 300 being each separate and distinct membranes from each other (e.g., not the single suspended membrane 114 to which the multiple piezoelectric actuators 102 are coupled to drive the regions 120a, 120b) and each being affixed by the portions 212 directly and separately to the main body portion 216 of the substrate allows for the operating bandwidth of the assemblies 200, 300 to be up to 10-megahertz (MHz). This increase in the operating bandwidth of the assemblies 200, 300 relative to the assembly 108 is due to each one of the respective membranes 214 being separately and directly affixed by the portions 212 and being separately and directly driven by a corresponding piezoelectric actuator 218 of the plurality of piezoelectric actuators 218 unlike driving the multiple separate regions 120a, 120b of the same single suspended membrane 114 with multiple respective piezoelectric actuators 102 that are coupled to the inner surface of the suspended membrane 114. In other words, the operating bandwidth of the assemblies 200, 300 is increased relative to the transducer assembly 100 as each one of the respective membranes 214 is separately and directly affixed to the main body portion 216 such that each of the respective membranes 214 may be driven with a corresponding piezoelectric actuator 218 of the plurality of piezoelectric actuators 218 without any cross-talk or disturbance to an adjacent membrane 214 of the plurality of membranes 214 that is driven at the same time.

In view of the above discussion, the operating bandwidth of the single suspended membrane 114 is limited to operating at frequencies ranging from 0.5-megahertz (MHz) to 4-megahertz (MHz) due to unwanted flexure modes (e.g., resonance flexure modes or runaway flexure modes) that occur at frequencies outside this range whereas the operating bandwidth of the plurality of membranes 214 ranges from 0.5-megaherz (MHz) to 10-megahertz (MHz). In other words, the operating bandwidth of the plurality of membranes 214 in the transducer assemblies 202, 302 is greater than the operating bandwidth of the suspended membrane 114 of the transducer assembly 100.

As the regions 120a, 120b of the suspended membrane 114 are separated by the first distance D1 that is greater than the distance D2 from which adjacent respective cavities 210 of the plurality of cavities 210 are spaced apart, a number of the plurality of piezoelectric actuators 102 that may be provided in a first area or volume in the transducer assembly 100 is less than a number of the plurality of piezoelectric actuators 218 that may be provided in the same first area or volume in the transducer assemblies 202, 302. In other words, a greater number of the piezoelectric actuators 218 in the transducer assemblies 202, 302 may be provided in the same amount of space as a lesser number of the piezoelectric actuators 102 in the transducer assembly 100. For example, five of the piezoelectric actuators 218 may be provided in the same amount of space in the transducer assemblies 202, 302 as three of the piezoelectric actuators 102 take up in the transducer assembly 100.

The increased number of the piezoelectric actuators 218 that may be provided in the same amount of space relative to the number of piezoelectric actuators that may be provided in that space allows for the transducer assemblies 202, 302 to be utilized to capture images (e.g., ultrasound images) of higher fidelity factor relative to captured images (e.g., ultrasound images) utilizing the transducer assembly 100. For example, the greater number of piezoelectric actuators 218 within the same space as the lesser number of the piezoelectric actuators 102 results in the transducer assemblies 202, 302 being capable of providing a greater number of pixels within a captured image (e.g., provide an increase in resolution) than capable by the lesser number of piezoelectric actuators 102 of the transducer assembly 100. In other words, the transducer assemblies 202, 302 allows for a captured image utilizing the transducer assemblies 202, 302 to have a higher resolution than a captured image utilizing the transducer assembly 100.

To summarize the above discussion, the transducer assemblies 202, 302 have a larger range of operating bandwidth than the transducer assembly 100, and the transducer assemblies 202, 302 may provide a greater number of the piezoelectric actuators 218 in the same amount of space in the transducer assemblies 202, 302 relative to a lesser number of the piezoelectric actuators 102 that take up the same amount of space in the transducer assembly 100. In other words, if the transducer assemblies 202, 302 have the same size and footprint as the transducer assembly 100, the transducer assemblies 202, 302 would have a greater number of the piezoelectric actuators 218 than the piezoelectric actuators 102 present in the transducer assembly 100.

FIG. 5 is a top plan view of the plurality of piezoelectric actuators 218 that are present along the first surface 206 of the substrate 204 as shown in FIGS. 3 and 4, respectively. As visible in FIG. 5, each respective membrane of the plurality of membranes 214 is spaced apart from an adjacent membrane 214 of the plurality of membranes 214 by the second distance D2 and has the width W1, which is a diameter of the membrane 214. As shown in FIG. 5, the plurality of electrical pathways are positioned in spaces between the adjacent membranes 214 of the plurality of membranes 214.

Figure 6A:
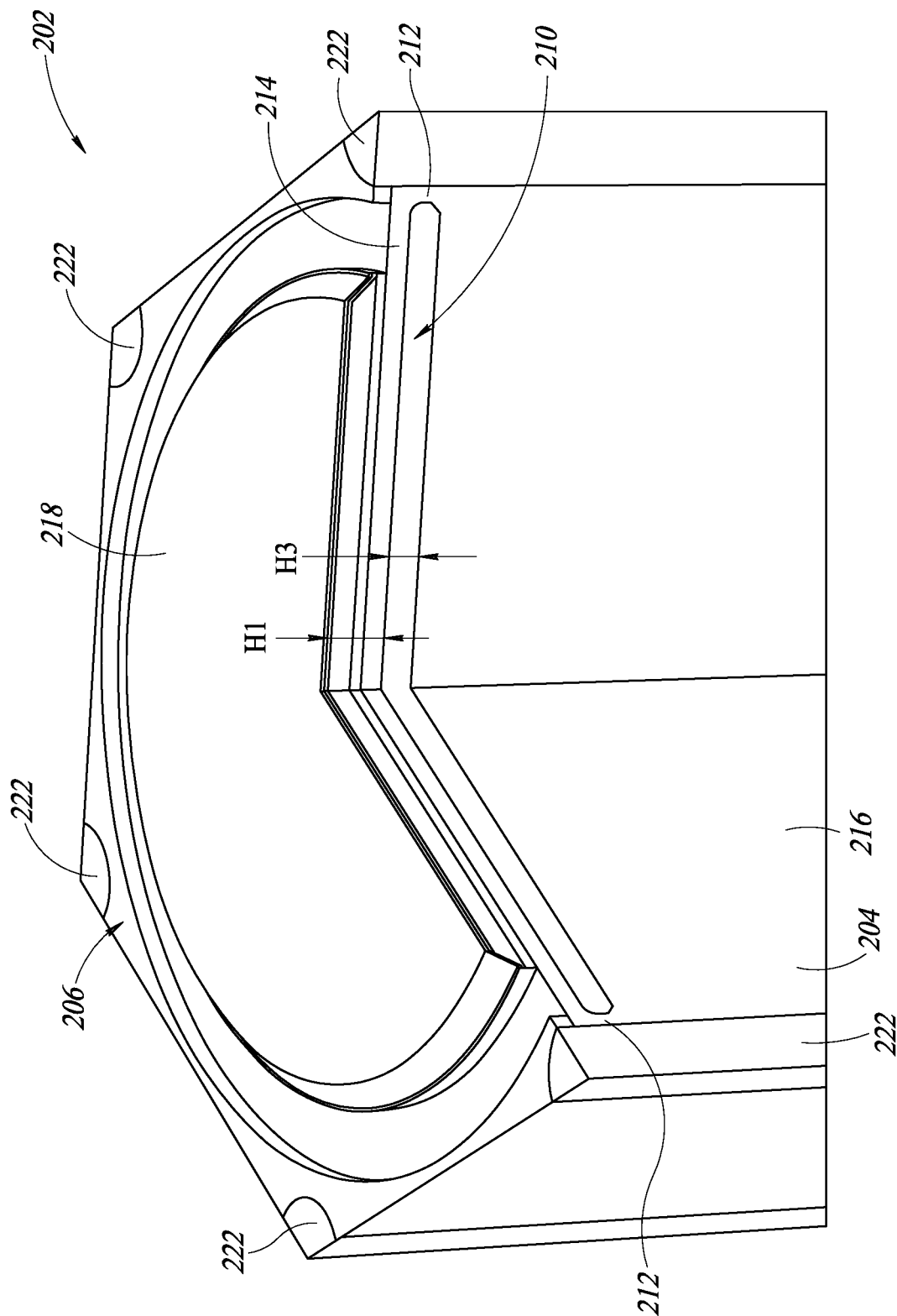
FIG. 6A is an enhanced view of a respective piezoelectric actuator of the plurality of piezoelectric actuators within encircled region A-A as shown in FIG. 5.

FIG. 6A is a zoomed in perspective and partial cross-sectional view along a region A-A as encircled by the dotted line as shown in FIG. 5 of the substrate 204 of the transducer assembly 202. As shown in FIG. 6A, the cross-section is taken along dotted line B-B as shown in FIG. 5. The cross-section taken along dotted line B-B extends through one of the plurality of piezoelectric actuators 218, one of the plurality of the membranes 214, one of the plurality of cavities 210, and at least two of the plurality of electrical pathways 222 that extend through the substrate 204.

Figure 6B:
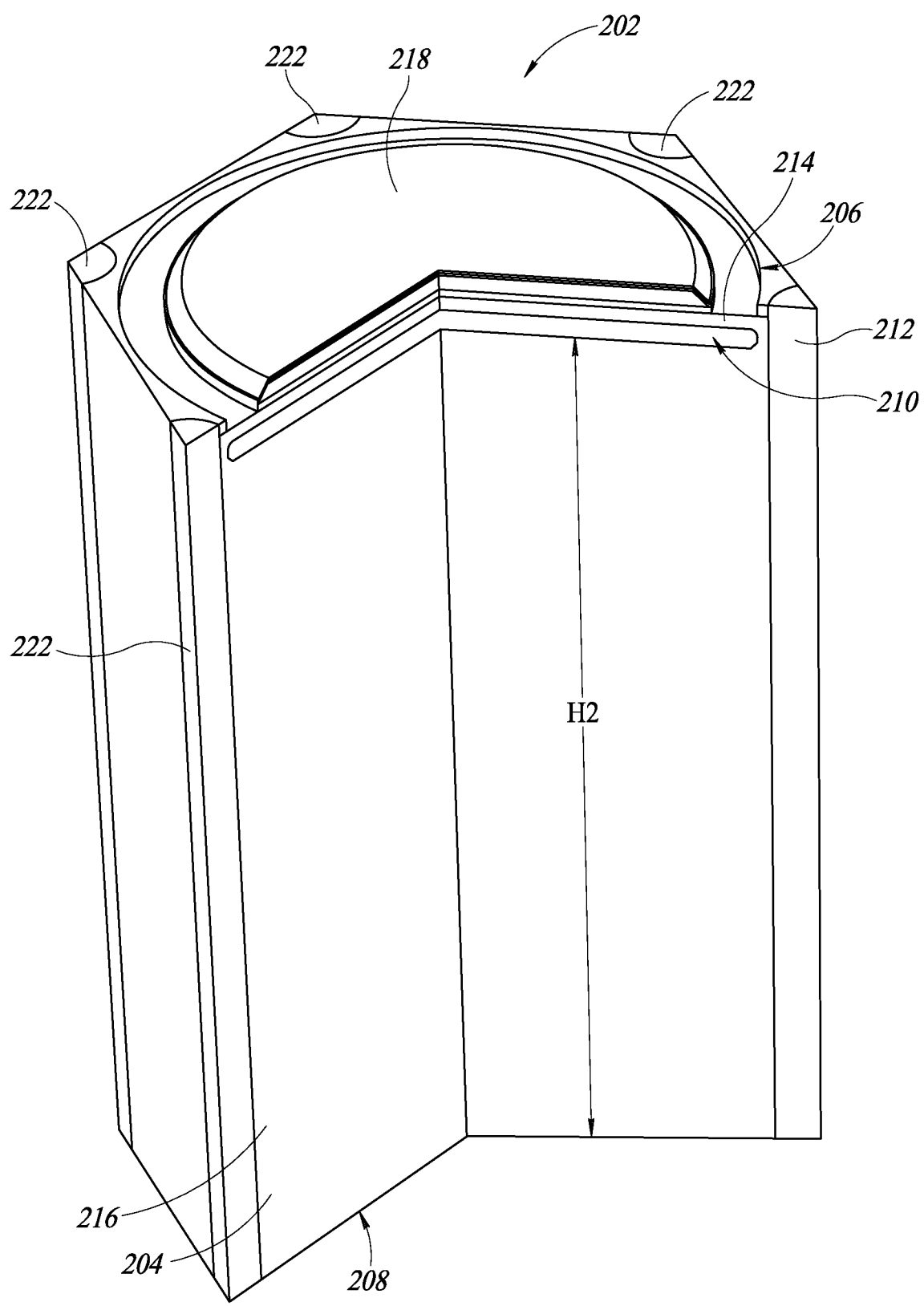
FIG. 6B is a zoomed out view of the enhanced view of the respective piezoelectric actuator of the plurality of piezoelectric actuators as shown in FIG. 6A.

FIG. 6B is a zoomed out perspective and partial cross-sectional view along a region A-A as encircled by the dotted line in FIG. 5 of the substrate 204 of the transducer assembly 202. As shown in FIG. 6B, the cross-section is taken along dotted line B-B as shown in FIG. 5. The cross-section taken along dotted line B-B extends through one of the plurality of piezoelectric actuators 218, one of the plurality of membranes 214, one of the plurality of cavities 210, and at least two of the plurality of electrical pathways 222 that extend through the substrate 204 from the first surface 206 to the second surface 208.

Figure 7:
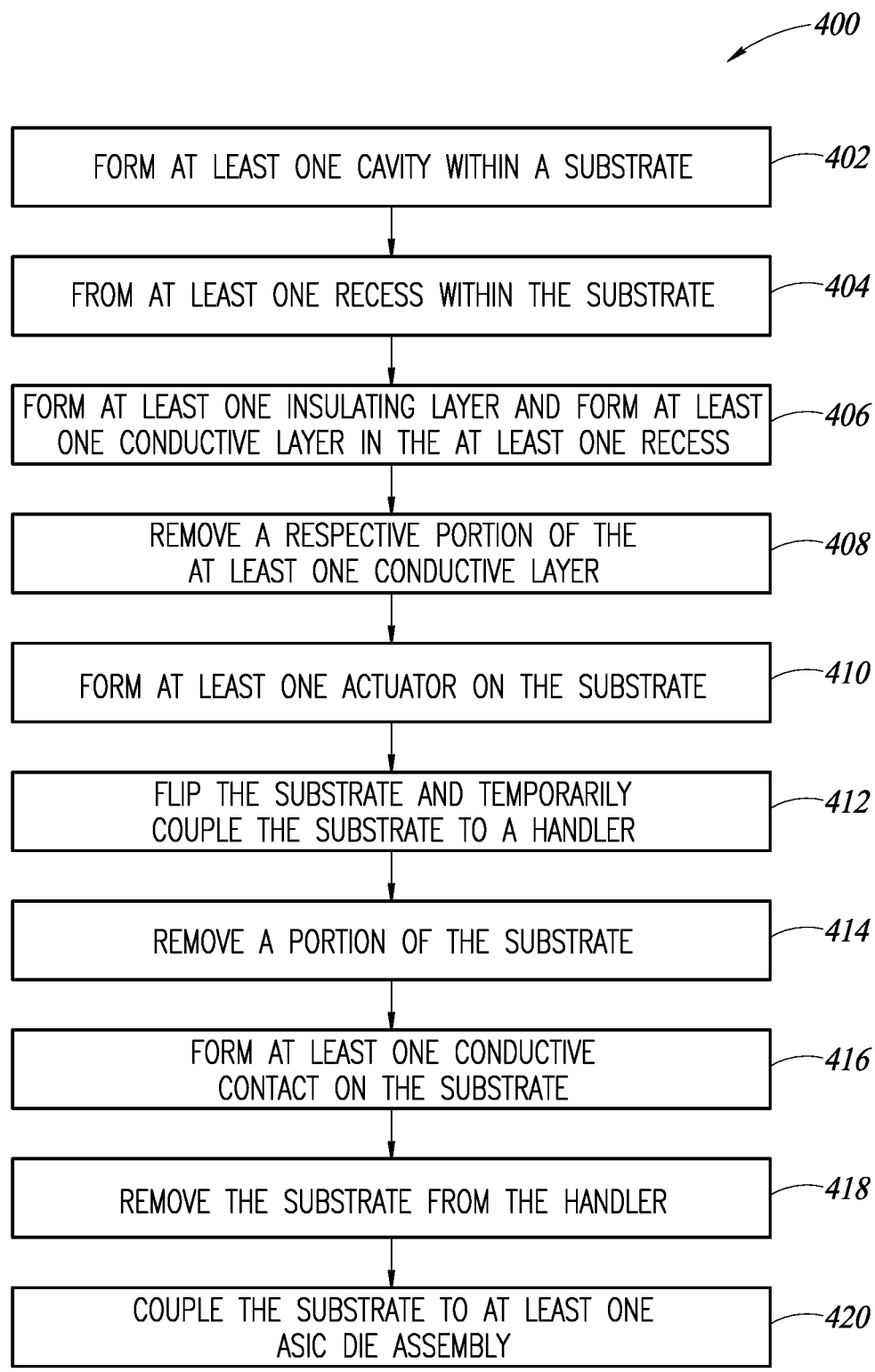
FIG. 7 is a flowchart of an embodiment of a method of manufacturing of the present disclosure for manufacturing the embodiment of the transducer assembly of the present disclosure as shown in FIG. 3.

FIG. 7 is directed to a flowchart 400 of an embodiment of a method of manufacturing the embodiment of the assembly 200 as shown in FIG. 3 of the present disclosure. The embodiment of the method of manufacturing in the flowchart 400 includes a first, second, third, fourth, fifth, sixth, seventh, eighth, ninth, and tenth steps 402, 404, 406, 408, 410, 412, 414, 416, 418, 420.

FIGS. 8A-8I are cross-sectional views of the respective steps 402, 404, 406, 408, 410, 412, 414, 416, 418, 420 of the flowchart 400 of the method of manufacturing the embodiment of the assembly 200 as shown in FIG. 3 of the present disclosure.

Figure 8A:
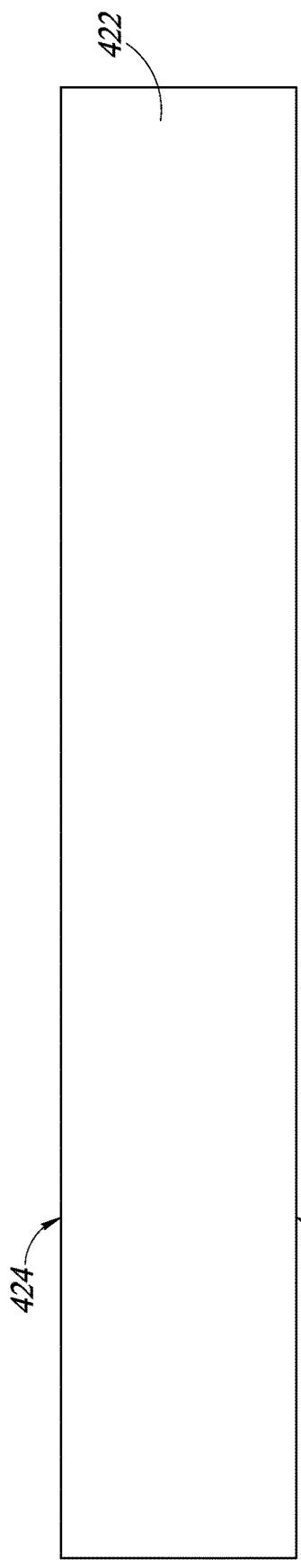

FIG. 8A is a cross-sectional view of a substrate body 422. The substrate body 422 is made of the same material as the substrate 204 and is eventually singulated to form the substrate 204 as in the assemblies 200, 300 as shown in FIGS. 3 and 4, respectively, of the present disclosure. The substrate body 422 includes a first surface 424 and a second surface 426 that is opposite to the first surface 424.

In the first step 402, a plurality of cavities 428, which are the same as the cavities 210 in the assemblies 200, 300, is formed within the substrate and is between the first surface 424 and the second surface 426 of the substrate body 422. The plurality of cavities 428 is formed closer to the first surface 424 than the second surface 426. The plurality of cavities 428 is formed buried or embedded within the substrate body 422. Forming the plurality of cavities 428 results in forming a plurality of membranes 427 as each respective cavity 428 is overlapped by a corresponding membrane 427. Some of the respective cavities 428 will become the plurality of cavities 210 and some of the respective membranes 427 will become the plurality of membranes 214 of the embodiment of the assembly 200 as shown in FIG. 3 of the present disclosure. The plurality of cavities 428, which is buried or embedded within the substrate body 422 between the first surface 424 and the second surface 426 and define the plurality of membranes 427, may be formed as described as directly follows herein.

For example, the plurality of cavities 428, which may be referred to as buried cavities, may be formed by in at least one embodiment in which in an initial step a resist layer is deposited directly on top of a surface 424 of the substrate 422 and is defined to form a patterned mask layer. After the pattern mask layer has been formed, exposed regions along the surface 424 of the substrate are exposed to an etchant to anisotropically etch, for example through an STS etch, the substrate forming trenches extending into the first surface 424 of the substrate 422. In greater detail, the trenches are substantially rectilinear and extend parallel to each other in a direction perpendicular, orthogonal, or transverse to the first surface 424. All the trenches are separated from one another by respective walls of the substrate 422 that were covered by the patterned mask layer.

Next, patterned mask layer is removed from the first surface 424 of the substrate 422, and an epitaxial growth is performed. The silicon or epitaxially grown material grows by a controlled amount on substrate 422 and expands laterally until openings of the trenches at the first surface 424 of the substrate are closed. Closing these openings of the trenches form preliminary or initial buried channels embedded in the substrate 422 that are completely surrounded by silicon. In an initial stage of the epitaxial growth, silicon grows also inside the trenches, before the openings of the trenches are closed. The initial or preliminary buried channels may have cross sections that are substantially oval and elongated at this stage in a direction perpendicular to the surface 424 of the substrate 424. After being formed, the preliminary or initial buried channels may house the same atmosphere in which the substrate 422 is immersed when the epitaxial growth is performed. For example, in some embodiments, this atmosphere may have a high hydrogen concentration and may be deoxidizing.

Figure 8B:
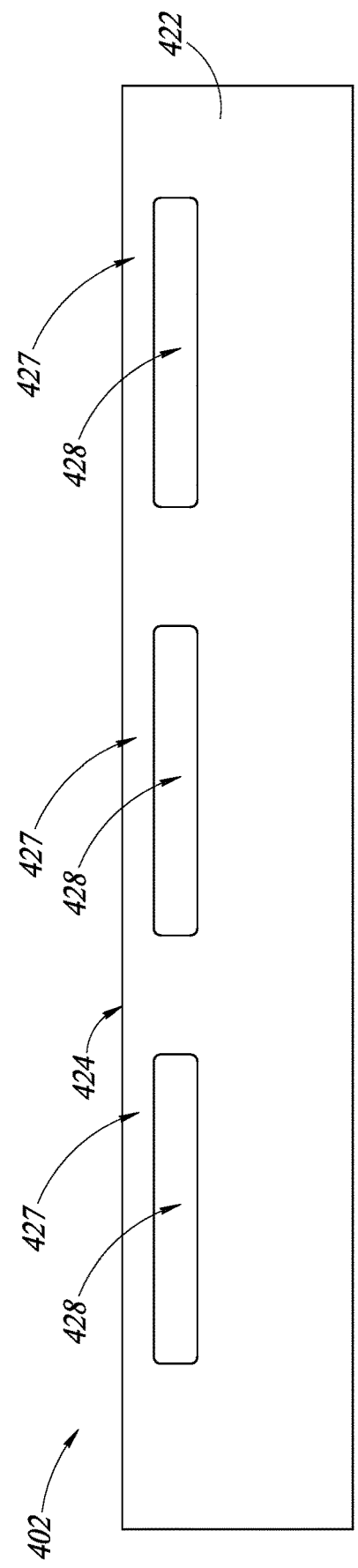

The initial or preliminary buried channels are subsequently modified by a thermal annealing process having a controlled duration to form the plurality of cavities 428 buried within the substrate 422 and having the size and shape as shown in FIG. 8B. For example, the substrate 422 is heated to 1150° C. for 5 hours. In this step there is no removal of silicon. In practice, when the substrate 422, which may be a wafer, is heated in a deoxidizing atmosphere, the superficial silicon atoms around the preliminary or initial buried channels migrate and tend to assume minimum energy distributions. In greater detail, the preliminary or initial buried channels, which initially have an oval cross section, tend to assume a substantially rectangular cross section as shown in FIG. 8B.

Figure 8C:
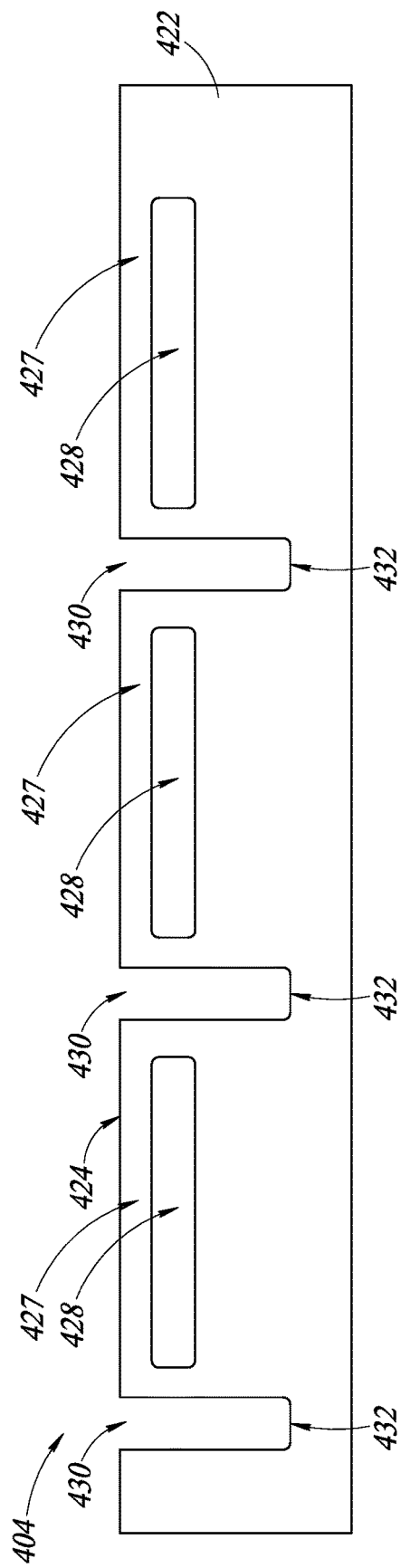

After the first step 402 as shown in FIG. 8B in which the plurality of cavities 428 is formed within the substrate body 422 between the first surface 424 and the second surface 426, in the second step 404 a plurality of recesses 430 is formed in the substrate body 422 as shown in FIG. 8C. The plurality of recesses 430 is formed to have a plurality of ends 432 that terminate within the substrate body between the first surface 424 and the second surface 426. For example, in at least one method of forming the plurality of recesses 430, a mask or resist layer (not shown) is formed on the first surface 424 at which point the mask or resist layer is patterned with openings that expose regions of the first surface 424 at which the plurality of recesses 430 are to be formed. After the mask or resist layer is formed and patterned with these openings, an etching is performed to remove portions of the substrate body 422 forming the plurality of recesses 430 within the substrate body 422 terminating at the plurality of ends 432 between the first surface 424 and the second surface 426 of the substrate body 422. In at least one embodiment, the plurality of recesses 430 may have a depth substantially equal to 150-micrometers (μm) that extends into the substrate body 422 from the first surface 424. In other words, the depth of the plurality of recesses 430 extends from the first surface 424 to the plurality of ends 432 of the plurality of recesses 430. After the plurality of recesses 430 is formed, the mask or resist layer is removed from the first surface 424 of the substrate body 422 resulting in the forming of the structure as shown in FIG. 8C.

After the second step 404 as shown in FIG. 8C in which the plurality of the recesses 430 is formed in the substrate body 422, in a third step 406 an oxide layer 434 and a conductive layer 436 are formed at and on the first surface 424 of the substrate body 422 and are formed in and lining the plurality of recesses 430. The oxide layer 434 may be a non-conductive layer, an insulating layer, or a non-conductive or insulating oxide layer. The conductive layer 436 may be a metal material, may be a doped silicon material, or may be some other conductive material that may be formed in the plurality of recesses 430 lined with the oxide layer 434 and on the oxide layer 434 on the first surface 424 of the substrate body 422. For example, in at least one embodiment, the oxide layer 434 may be formed by an oxidization process known to the semiconductor industry in which a thin layer of the oxide layer is formed along the first surface of the substrate body 422 and on respective surfaces of the substrate body 422 delimiting the plurality of recesses 430 by oxidizing the substrate body 422 along these respective surfaces. After the oxide layer 434 is formed, the conductive layer 436 may be formed on the oxide layer 434 by forming a doped polysilicon material on the oxide layer 434 and within the plurality of recesses 430 filling the plurality of recesses 430 with the doped polysilicon material. In some embodiments, the doped polysilicon layer may be formed by a chemical vapor deposition (CVD) process known to the semiconductor industry on the oxide layer 434 and within the plurality of recesses 430. The conductive layer 436 includes a plurality of first portions 436a that are present within the plurality of recesses 430 and includes a second portion 436b that extends along the oxide layer 434 on the first surface 424 of the substrate body 422.

Figure 8D:
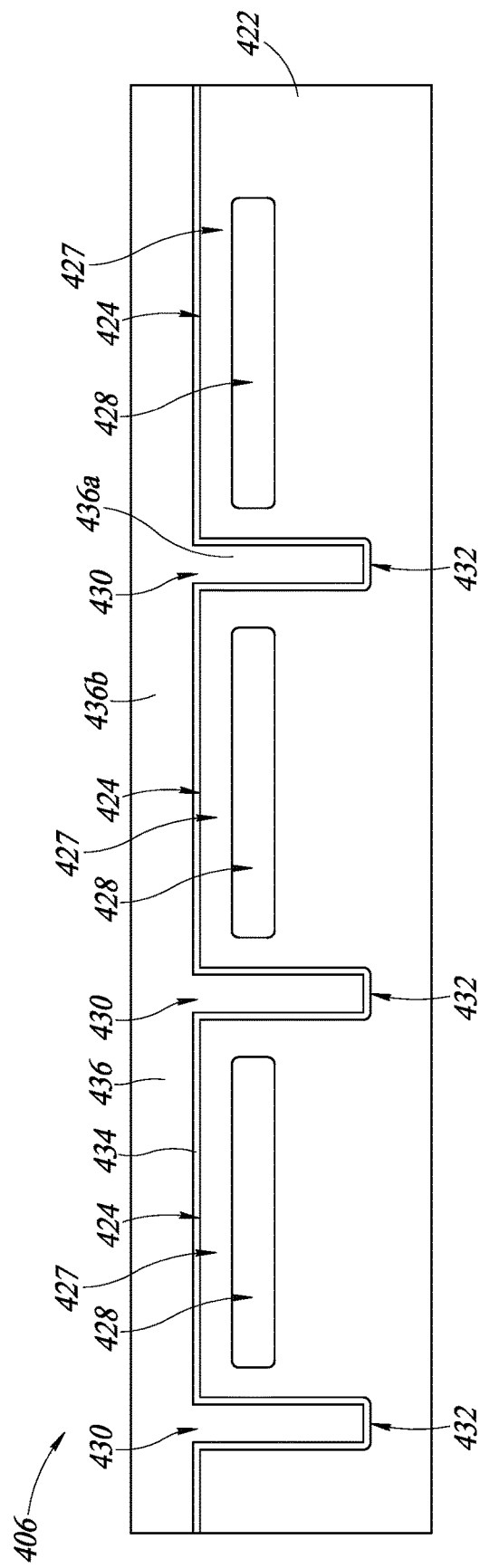

After the third step 406 as shown in FIG. 8D in which the oxide layer 434 and the conductive layer 436, which may be a polysilicon material in some embodiments, are formed, in a fourth step 408 the second portion 436b of the conductive layer 436 is removed in which a plurality of ends 438 of the plurality of first portions 436a of the conductive layer 436 is formed and exposed as shown in FIG. 8E. The second portion 436b of the conductive layer 436 may be removed by a chemical-mechanical polishing (CMP) technique or process known within the semiconductor industry. Removing the second portion 436b of the conductive layer 436 exposes the oxide layer 434 along the first surface of the substrate body 422 and forms the plurality of ends 438 of the plurality of first portions 436a. The plurality of first portions 436a will eventually become the plurality of electrical pathways 222.

After the fourth step 408 as shown in FIG. 8E in which the second portion 436b of the conductive layer 436 is removed, in a fifth step 410 a plurality of piezoelectric actuators 440 is formed on the oxide layer 434 present along the first surface of the substrate body 422. At least some of the respective piezoelectric actuators 440 of the plurality of piezoelectric actuators 440 will become the plurality of piezoelectric actuators 218 of the embodiment of the assembly 200 as shown in FIG. 3 of the present disclosure. The plurality of piezoelectric actuators 440 may be formed by performing one or more deposition techniques known within the semiconductor industry along with one or more patterning steps known within the semiconductor industry to form the piezoelectric actuators 440 as shown in FIG. 8F. Each respective piezoelectric actuator 440 of the plurality of piezoelectric actuators 440 is formed on a corresponding membrane.

In the fifth step 410, forming the plurality of piezoelectric actuators 440 includes forming a plurality of conductive layers 442. For example, the plurality of conductive layers 442 may be formed by forming a mask or resist layer on the plurality of piezoelectric actuators and patterning the mask or resist layer to form openings corresponding to the structure of the plurality of conductive layers 442 and then depositing a conductive material (e.g., a metal material such as copper, gold, silver, etc.) within those openings in the mask or resist layer forming the plurality of conductive layers 442. Each respective conductive layer 442 of the plurality of conductive layers 442 couples a respective piezoelectric actuator 440 of the plurality of piezoelectric actuators 440 to a corresponding first portion 436a of the conductive layer 436. As shown in FIG. 8F, each respective conductive layer 442 of the plurality of conductive layers 442 is on and coupled to a corresponding end 438 of a corresponding first portion 436a of the conductive layer 436.

Figure 8G:
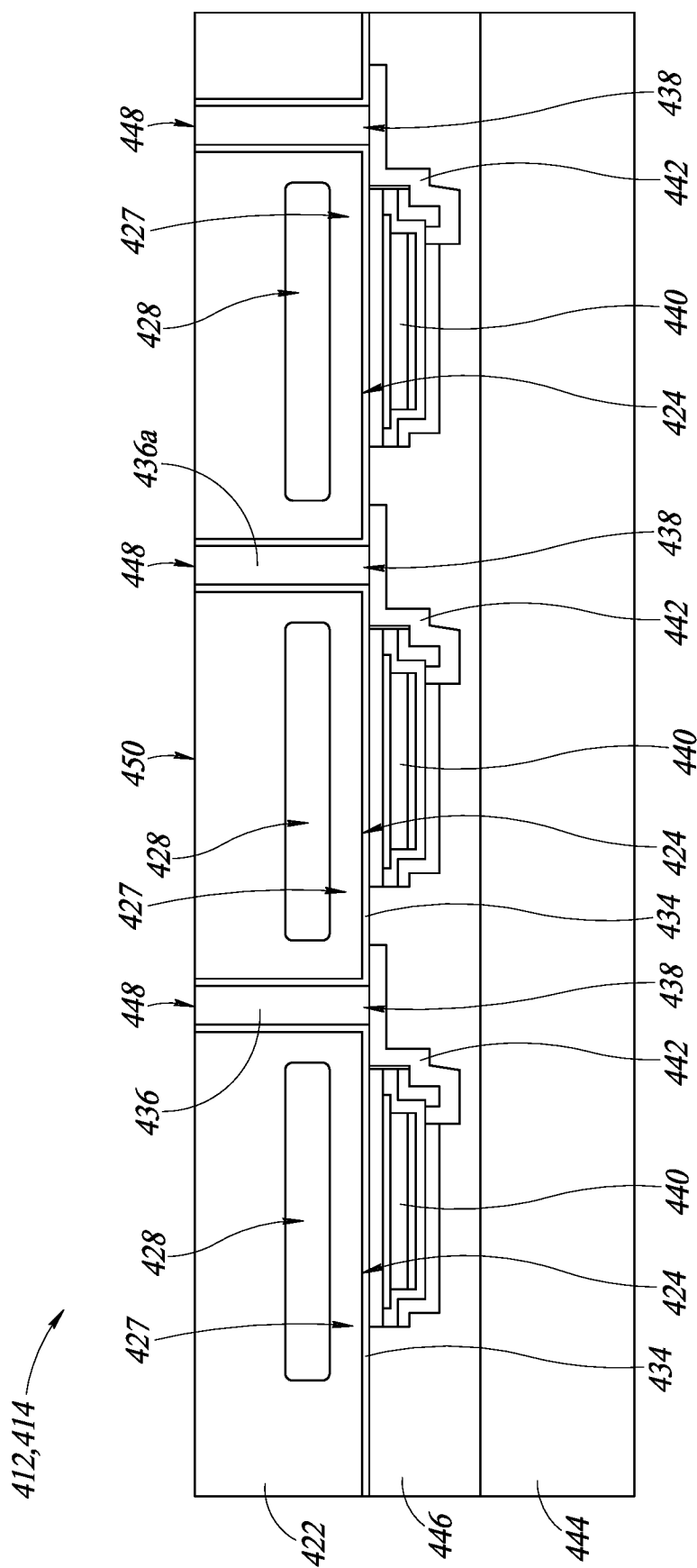

After the fifth step 410 in which the plurality of piezoelectric actuators 440 is formed, in a sixth step 412 the structure as shown in FIG. 8F is flipped and is temporarily coupled to a wafer handler or support 444 by a temporary adhesive 446 as shown in FIG. 8G. For example, the structure as shown in FIG. 8F may be flipped by a pick and place machine and then placed on the temporary adhesive 446 by the pick and place machine. As shown in FIG. 8G, the plurality of piezoelectric actuators 440 and the plurality of conductive layers 442 are within the temporary adhesive layer 446, which may be a layer that may degrade or be dissolved by being exposed to heat or to some other factor or quality such that the structure temporarily adhered to the wafer handler 444 by the temporary adhesive 446 may be removed later on in the method of manufacturing the embodiment of the assembly 200 as shown in FIG. 3.

After the sixth step 412 in which the structure as shown in FIG. 8F is flipped and placed on the wafer handler 444, in a seventh step 414 a respective portion of the substrate body 422 at the second surface 426 and respective portions of the oxide layer 434 is removed as shown in FIG. 8G. Removing the respective portion of the substrate body 422 at the second surface 426 of the substrate body 422 and removing the respective portions of the oxide layer 434 results in respective ends 448 being formed and exposed, as well as a third surface 450 of the substrate body 422 being formed. The respective portion of the substrate body 422 and the respective portions of the oxide layer 434 may be removed by a chemical-mechanical polishing (CMP) technique process known to the semiconductor industry, which may be similar to the earlier CMP technique or process utilized in removing second portion 436b of the conductive layer 436. After the removal of the respective portion of the substrate body 422 and the respective portions of the oxide layer 434, the plurality of ends 448, which is opposite to the plurality of ends 438, is exposed at the third surface 450 of the substrate body 422.

Figure 8H:
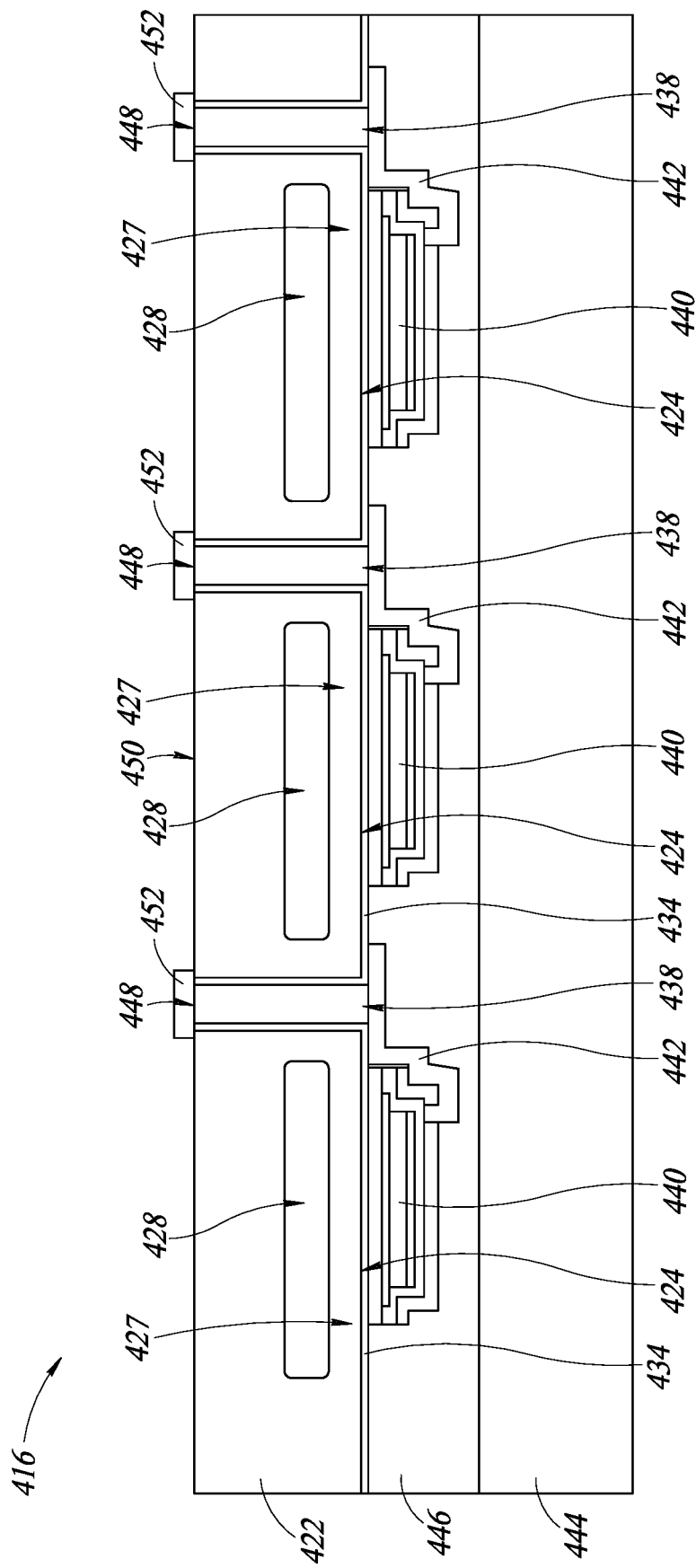

After the sixth step 412 in which the structure as shown in FIG. 8F is flipped and coupled to the wafer handler 444 by the temporary adhesive 446 and the seventh step 414 in which the respective portions of the substrate portion 422 and the oxide layer 434 are removed, in an eighth step 416 a plurality of contact pads 452 is formed on the plurality ends 448 of the conductive layer 436 exposed at the third surface 450 of the substrate body 422 as shown in FIG. 8H. The plurality of contact pads 452 may be formed by forming a mask or resist layer on the third surface 450, patterning the mask or resist layer with openings exposing the plurality of ends 448 from the mask or resist layer, and then depositing or forming a conductive material (e.g., a metal material such as copper, silver, gold, etc.) within the openings forming the plurality of contact pads 452. After the plurality of contact pads 452 is formed, the mask or resist layer is removed such that the third surface 450 of the substrate body 422 is exposed as shown in FIG. 8H. The plurality of contact pads 452 is eventually utilized in forming the plurality of conductive structures 226 in the embodiment of the assembly 200 as shown in FIG. 3 of the present disclosure.

Figure 8I:
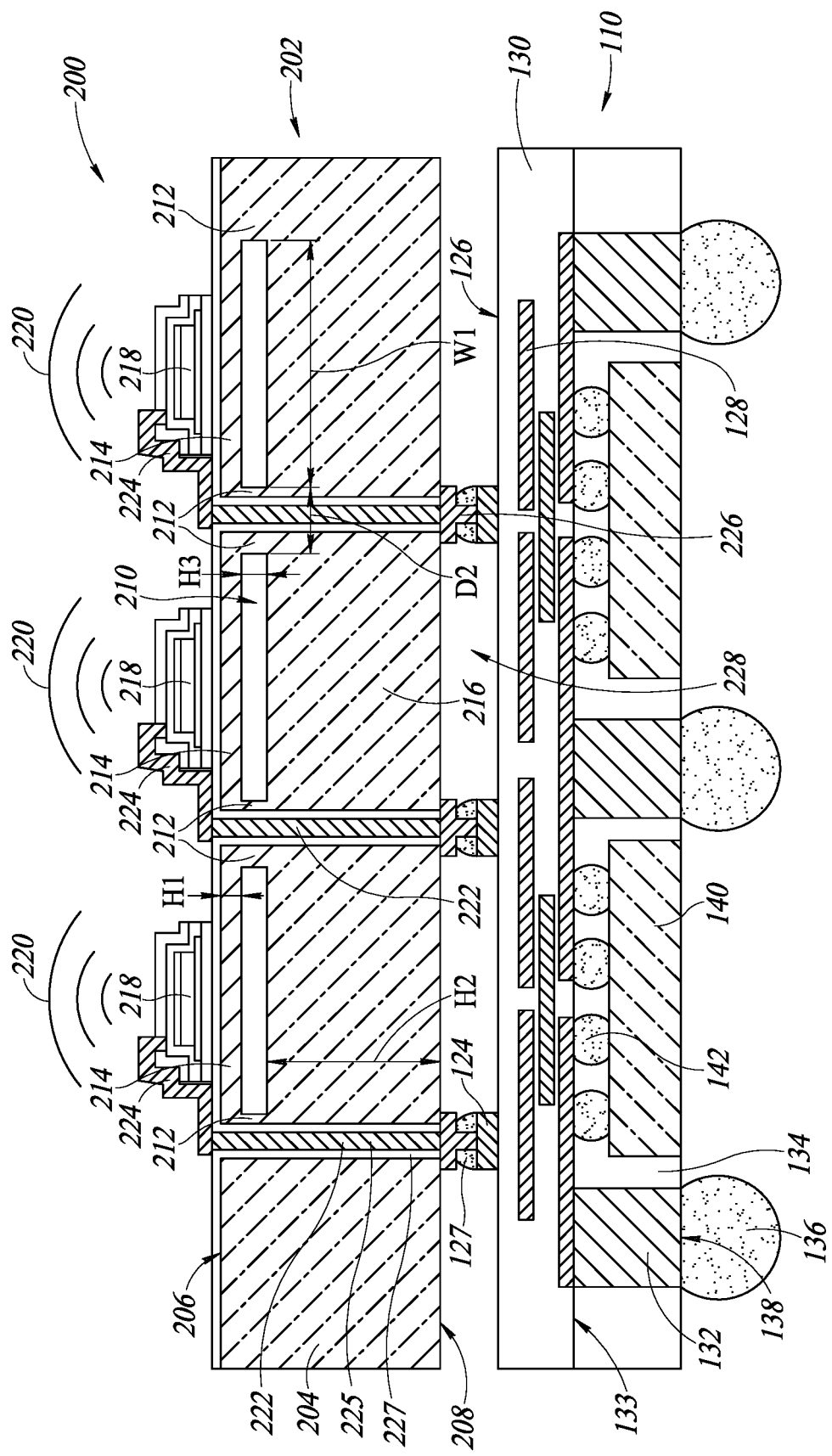

After the eighth step 416 in which the plurality of contact pads 452 is formed, in a ninth step 418 the structure as shown in FIG. 8H is removed from the wafer handler 444, and in a tenth step 420 the structure as shown in FIG. 8H is singulated and coupled to an ASIC assembly 110, as shown in FIG. 8I such that the embodiment of the assembly 200 as shown in FIG. 3 is manufactured. For example, in the ninth step 418, when the temporary adhesive 446 may be degraded or dissolved by being exposed to heat, the temporary adhesive 446 is exposed to heat such that a pick and place machine may remove the structure as shown in FIG. 8H from the wafer handler 444. After the structure as shown in FIG. 8H is removed from the wafer handler 444 in the ninth step 418, in the tenth step 420 the structure as shown in FIG. 8H, which remains a portion of a larger wafer (not shown) in which there are several regions of the wafer that has the structure as shown in FIG. 8H, is singulated forming the transducer assembly 202 as shown in FIG. 3. The plurality of contact pads 452 is then coupled to the ASIC assembly 110 utilizing the solder material 127 as shown in FIG. 8I.

After the transducer assembly 202 is coupled to the ASIC assembly 110, the assembly 200 as shown in FIG. 3 has been manufactured.

In an alternative embodiment, the singulation of the larger wafer that includes the structure as shown in FIG. 8H may occur before removing the structure as shown in FIG. 8H from the wafer handler 444 by degrading or dissolving the temporary adhesive 446. At which point the structure as shown in FIG. 8H is coupled to the ASIC assembly 110 in the same fashion as discussed earlier herein.

Figure 9:
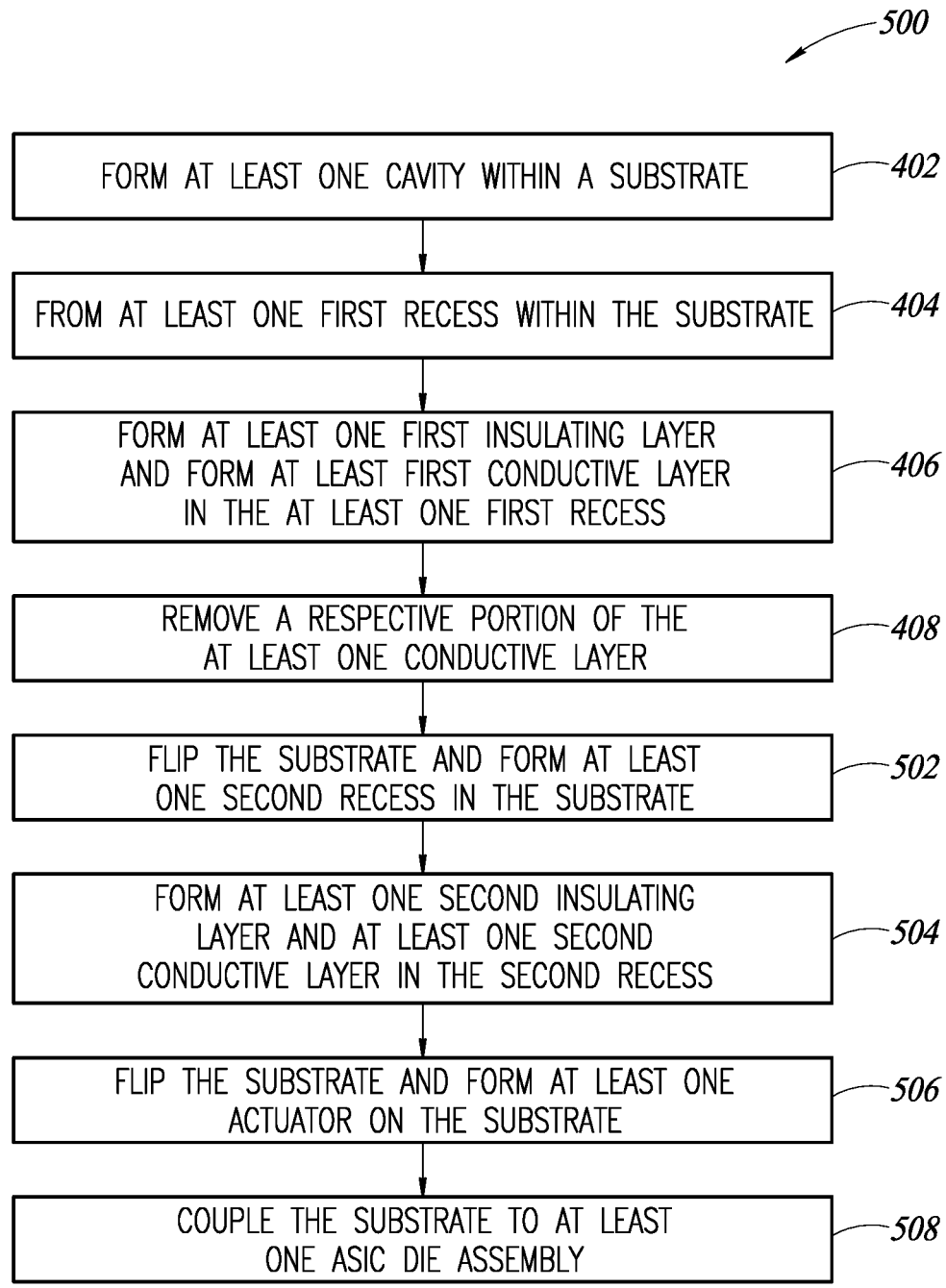
FIG. 9 is a flowchart of an alternative embodiment of a method of manufacturing of the present disclosure for manufacturing the alternative embodiment of the transducer assembly of the present disclosure as shown in FIG. 4.

FIG. 9 is directed to a flowchart 500 of an embodiment of a method of manufacturing the embodiment of the assembly 300 as shown in FIG. 4 of the present disclosure. The method of manufacturing in the flowchart 500 for manufacturing the embodiment of the assembly 300 includes some of the same respective steps as the method of manufacturing the embodiment in the flowchart 400 for manufacturing the embodiment of the assembly 200. For example, the method of manufacturing in the flowchart 500 includes the first step 402 in which the plurality of cavities 428 is formed within the substrate body 422, the second step 404 in which the plurality of first recesses 430 is formed within the substrate body 422, the third step 406 in which the oxide layer 434 and the conductive layer are formed, and the fourth step 408 in which the second portion 436b of the conductive layer 436 is removed. For the sake of simplicity and brevity of the present disclosure, the details of the first, second, third, and fourth steps 402, 404, 406, 408 respectively, are not reproduced herein as the details of the first, second, third, and fourth steps 402, 404, 406, 408, respectively, were described in detail earlier herein with respect to FIGS. 8B, 8C, 8D, and 8E of the present disclosure. The flowchart 500 of the method of manufacturing the embodiment of the assembly 300 as shown in FIG. 4 further includes a fifth step 502, a sixth step 504, a seventh step 506, and an eighth step 508.

FIGS. 10A-10D are cross-sectional views of the respective steps of the flowchart 500 of embodiment of the method of manufacturing the embodiment of the assembly 300 as shown in FIG. 4 of the present disclosure.

In the method of manufacturing as in the flowchart 500 for manufacturing the embodiment of the assembly 300 as shown in FIG. 4 of the present disclosure, the first, second, third, and fourth steps 402, 404, 406, 408, respectively, are carried out in the same or similar fashion as the method of manufacturing as in the flowchart 400 for manufacturing the embodiment of the assembly 200. In other words, after the fourth step 408 in the method of manufacturing as in the flowchart 500 for manufacturing the embodiment of the assembly 300 as shown in FIG. 4, the substrate body 422, the oxide layer 434, and the conductive layer 436 have the structure as shown in FIG. 8E in which the plurality of cavities 428 have been formed and the plurality of recesses 430 have been filled with the conductive layer 436.

Figure 10A:
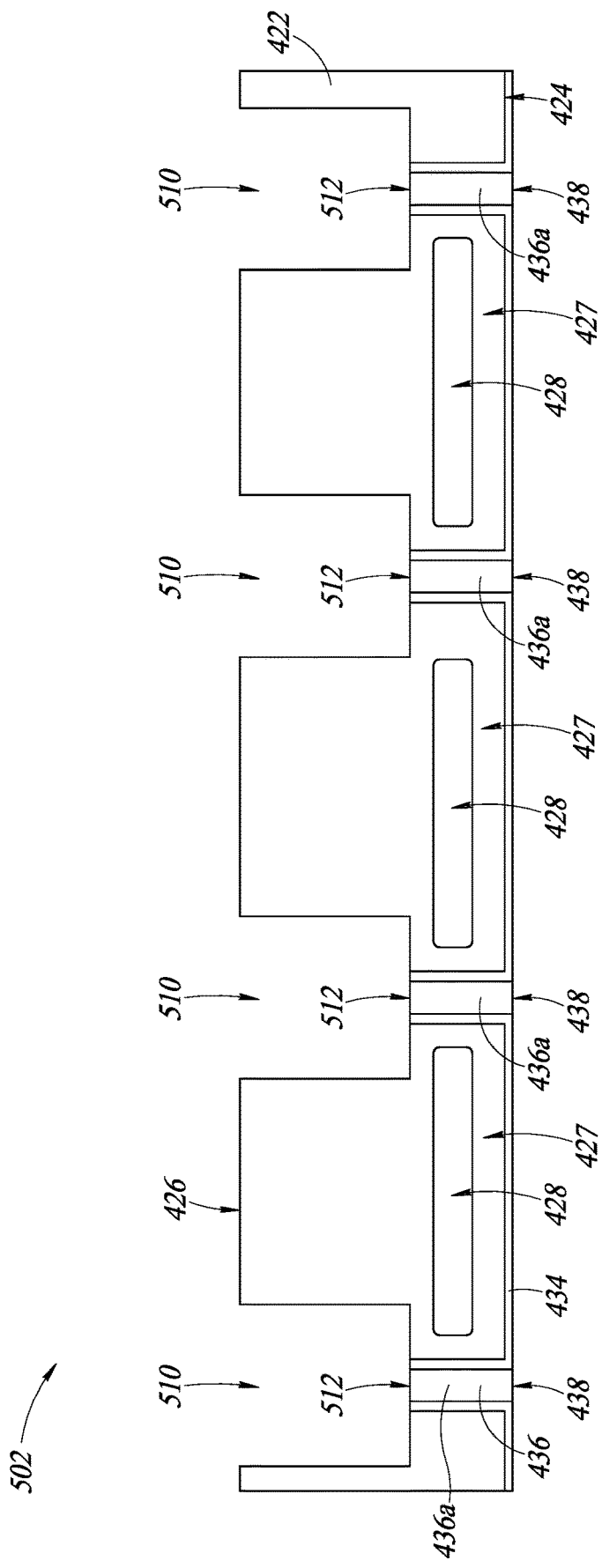
FIGS. 10A-10D are cross-sectional views of respective steps of the alternative embodiment of the method of manufacturing in the flowchart as shown in FIG. 9.

After the fourth step 408 in which the structure as shown in FIG. 8E has been formed, in the fifth step 502 the substrate body 422 is flipped such that second surface 426 of the substrate body 422 is facing upward based on the orientation as shown in FIG. 10A and then a plurality of second recesses is formed extending into the second surface 426 to the plurality of first portions 436a of the conductive layer 436. Each respective second recess 510 of the plurality of second recesses 510 extends to a corresponding first portion 436a of the conductive layer 436 within the plurality of first recesses 430. Forming the plurality of second recesses 510 forms respective ends 512 of the first portions 436a of the conductive layer 436 in the plurality of first recesses 430. Forming the plurality of second recesses 510 may remove respective portions of the first portions 436a of the conductive layer 436 and respective portions of the oxide layer 434 that are present within the plurality of first recesses 430. The plurality of second recesses 510 are formed to be wider than the plurality of first portions 436a of the conductive layer 436 and wider than the plurality of first recesses 430. For example, the plurality of second recesses 510 may be formed by forming a mask or resist layer (not shown) on the second surface 426 of the substrate body 422, patterning the mask or resist layer with openings that correspond to regions along the second surface 426 at which the plurality of second recesses 510 is to be formed, and etching those corresponding regions along the second surface 426 exposed by the openings in the mask or resist layer forming the plurality of second recesses 510.

After the fifth step 502 in which the substrate body 422 is flipped and the plurality of second recesses 510 is formed in the substrate body 422, in a sixth step 504 a seed layer 514 is formed in the plurality of second recesses 510 and a second conductive layer 516 is formed in the plurality of second recesses 510 and on the seed layer 514. For example, the seed layer 514 is formed in and to line the plurality of second recesses 510 by depositing a small amount of a conductive material (e.g., copper, gold silver, etc.) within the plurality of second recesses 510 to form the thin seed layer 514. In some embodiments, the seed layer 514 may be formed by sputtering the conductive material within the plurality of second recesses 510 to form the thin seed layer 514. After the seed layer 514 is formed within the plurality of second recesses 510, the second conductive layer 516 is formed on the seed layer 514 by forming a conductive material (e.g., copper, gold, silver, etc.) on the seed layer 514. For example, the second conductive layer 516 may be formed by performing an electroplating technique or process known within the semiconductor industry in which the structure including the seed layer 514 is submerged within an electroplating solution at which point the electroplating technique or process known within the semiconductor industry is carried out to form the second conductive layer 516 within the plurality of second recesses 510 and on the seed layer 514.

Figure 10B:
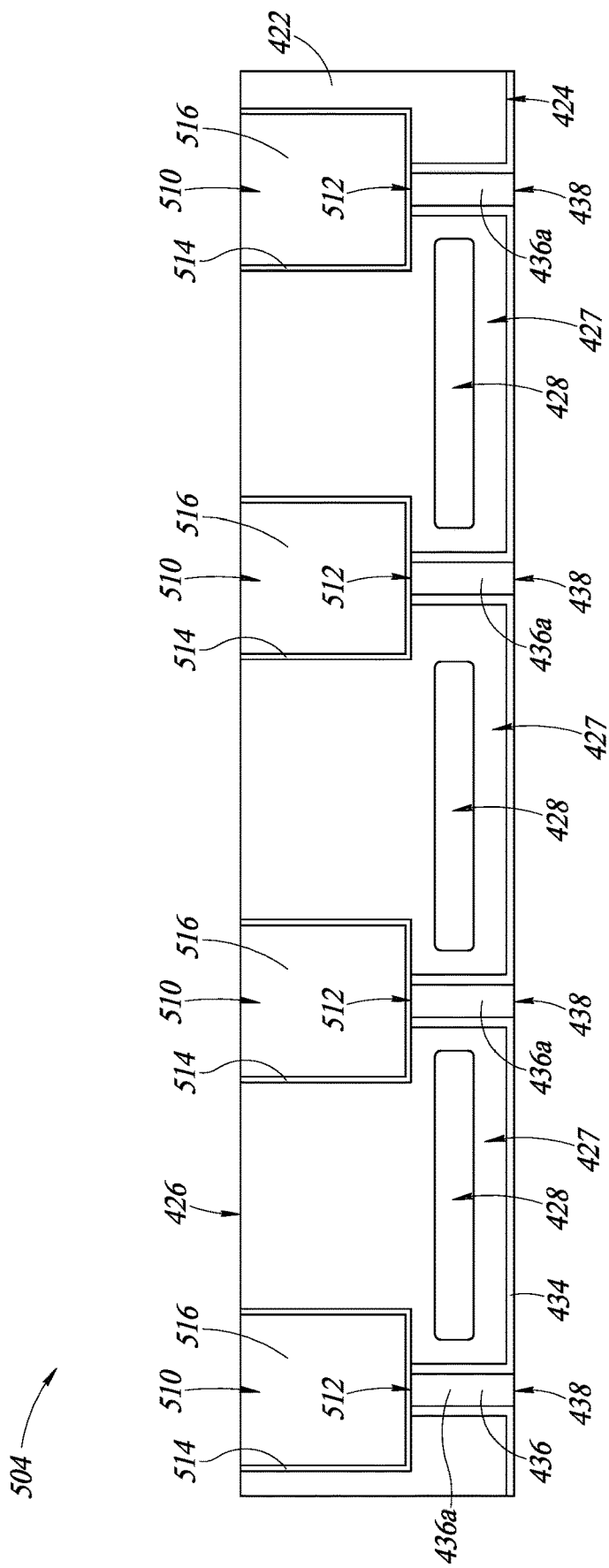
Figure 10C:
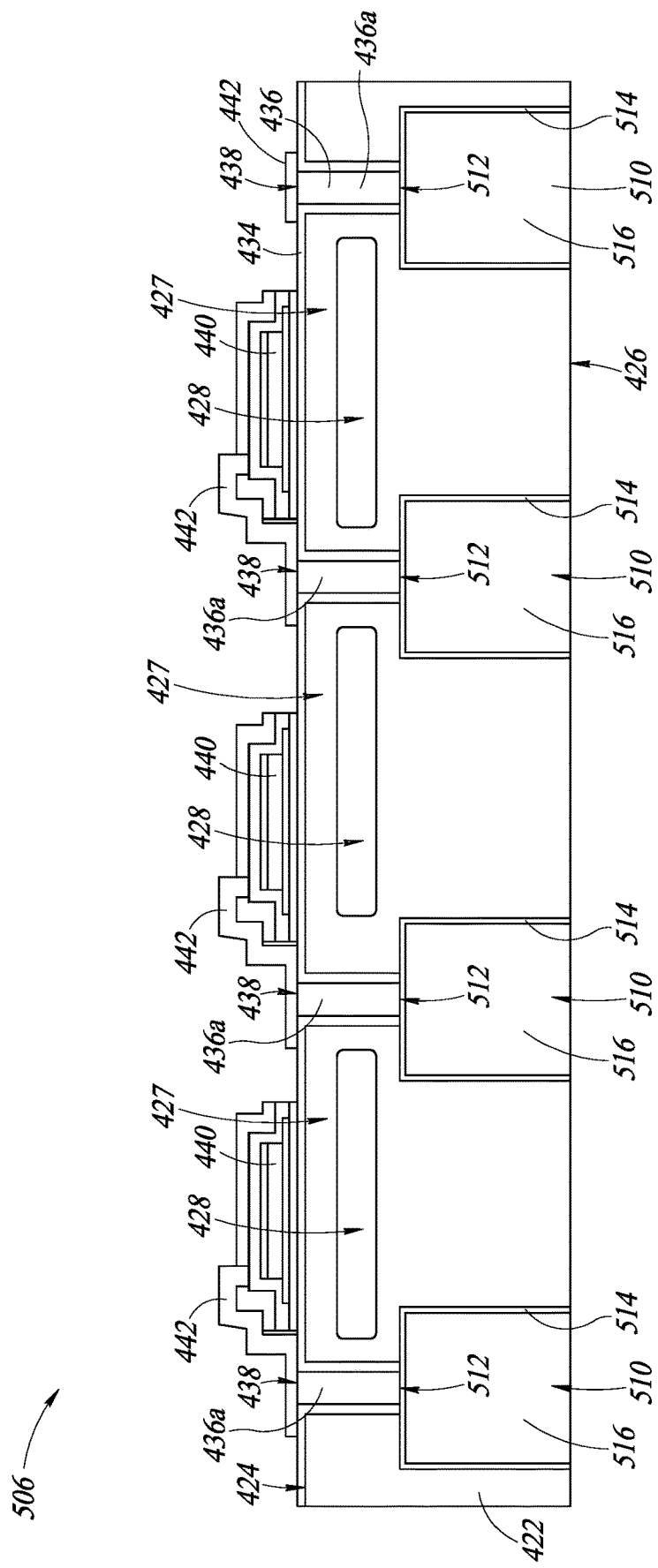
Figure 10D:
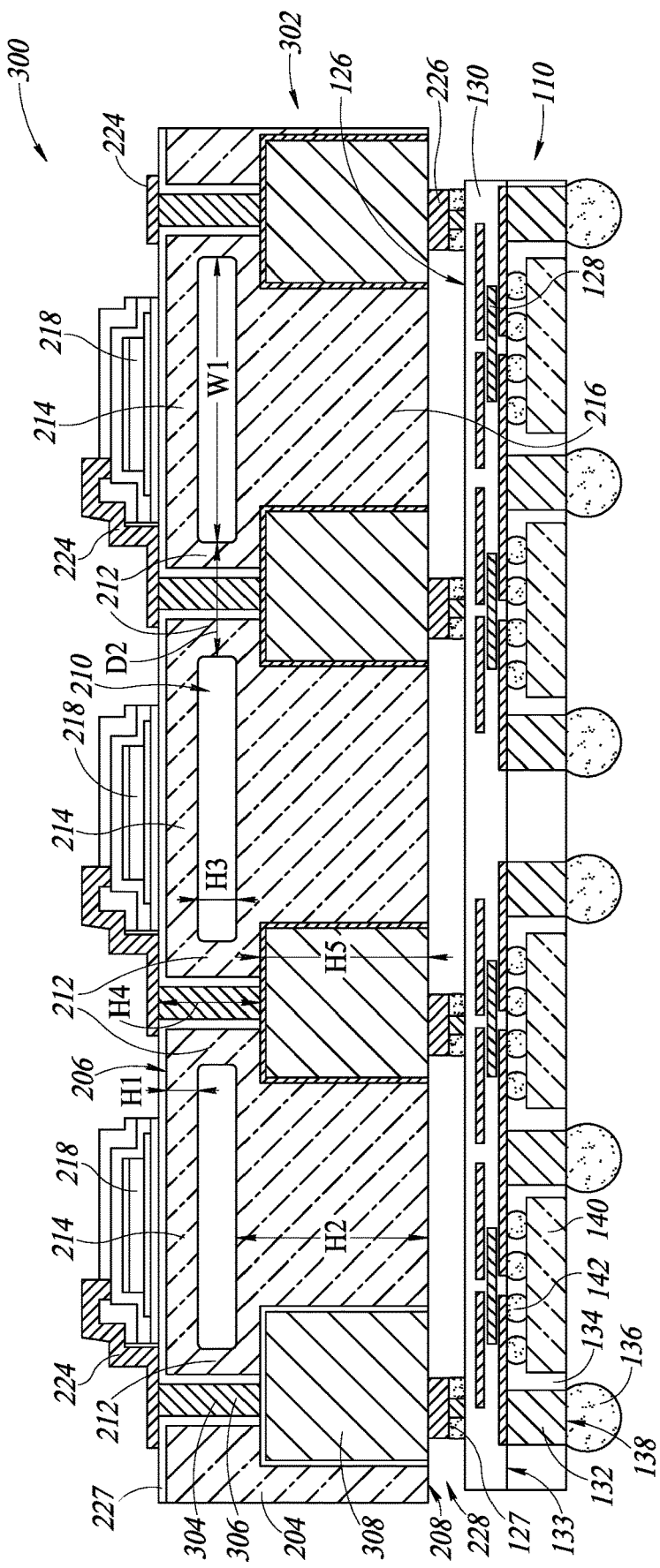

After the sixth step 504 in which the seed layer 514 and the second conductive layer 516 are formed in the plurality of second recesses 510, in a seventh step 506 the structure as shown in FIG. 10B is flipped, for example, by a pick and place machine or by some other semiconductor manufacturing tool, such that the first surface 424 is upward based on the orientation as shown in FIG. 10C. After the structure as shown in FIG. 10B is flipped to have the orientation as shown in FIG. 10C, the plurality of piezoelectric actuators 440 and the conductive layers 442 are formed on the oxide layer 434 present on the first surface 424 of the substrate body 422. The plurality of piezoelectric actuators 440 may be formed in the same or similar fashion as discussed in detail earlier herein with respect to the forming the plurality of piezoelectric actuators 440 and the conductive layers 442 in the fifth step 410 of the flowchart 400 as shown in FIG. 8F of the present disclosure.

After the seventh step 506 in which the plurality of piezoelectric actuators 440 and the conductive layers 442 are formed as shown in FIG. 10C, in an eighth step 508 the structure as shown in FIG. 10, which is part of a larger wafer, is singulated forming the transducer assembly 302. After the transducer assembly 302 is formed, the transducer assembly 302 is coupled to the ASIC assembly 110 utilizing the solder material 127 and the plurality of conductive structures 226.

As discussed in the present disclosure, the respective buried cavities 210 of the various embodiments (e.g., see FIGS. 3 and 4) that form and define the respective membranes 214 allows the frequency of the respective piezoelectric actuators 218 of the various embodiments to be operated ranging from 0.5-megahertz (MHz) to 10-megahertz (MHz), and may be operated at frequencies equal to the upper (10-MHz) and lower ends (0.5 MHz) of this range. This range may be referred to as an operating bandwidth of the embodiments of the transducer assembly of the present disclosure. The various embodiments of the present disclosure have a larger operating frequency range as compared to the transducer assembly 100 as shown in FIG. 2 of the present disclosure, which, as discussed earlier herein, may have an operating bandwidth that only allows for operating frequencies of 4-MHz or less. The various embodiments of the transducer assemblies of the present disclosure have the greater operating bandwidth as compared to the transducer assembly as shown in FIG. 2 of the present disclosure, as the embodiment of the transducer assemblies are formed to result in flexure modes to occur outside this increased operating bandwidth range.

As discussed in the present disclosure, the respective buried cavities 210 of the various embodiments (e.g., see FIGS. 3 and 4) that form and define the respective membranes 214 allow the fidelity of the ultrasonic images captured by the embodiments of the transducer assemblies to be greater than the fidelity of ultrasonic images captured by the transducer assembly as shown in FIG. 2 of the present disclosure. The fidelity is increased as the respective buried cavities 210 define and form the respective portions 212 of the present disclosure that act as anchor along respective ends or peripheral edges of the respective membranes 214. As these respective portions 212 are integral to the respective main body 216 of the respective substrates 204, the respective dimensions W1, D2 may be reduced such that the respective piezoelectric actuators 218 are placed closer together relative to the piezoelectric actuators 102 in the transducer assembly 100 as shown in FIG. 2. In other words, the various embodiments of the transducer assemblies 202, 302 of the present disclosure may have a greater concentration and number of the respective piezoelectric actuators 218 in the same sized area as the concentration and number of the piezoelectric actuators 102 of the transducer assembly 100 as shown in FIG. 2. This increased concentration or number of respective piezoelectric actuators 218 relative to the piezoelectric actuators 102 of the transducer assembly 100 as shown in FIG. 2, results in ultrasonic images captured by the various embodiments of the transducer assemblies 202, 302 of the present disclosure having greater fidelity (e.g., higher fidelity factor) relative to the ultrasonic images as captured by the transducer assembly 100 as shown in FIG. 2 as a greater number of pixels may be generated or captured to generate the ultrasonic images captured by the various embodiments of the transducer assemblies 202, 302 of the present disclosure relative to the transducer assembly 100 as shown in FIG. 2.

While not shown, in some embodiments, the respective piezoelectric actuators 218 may be covered by a material that results in ultrasound waves generated by the respective piezoelectric actuators 218 being compatible with imaging objects internal to a human being or being more compatible with imaging objects of organic material. For example, the material may be silicon nitride (SiN), and the material may be present on the first surface 206 and covering the respective piezoelectric actuators 218 as shown in the embodiments in FIGS. 3 and 4 of the present disclosure.

At least one embodiment of a device of the present disclosure may include: a transducer assembly including: a substrate having a first surface and a second surface opposite to the first surface; an array of piezoelectric actuators on the first surface of the substrate; an array of cavities enclosed within the substrate, each respective cavity of the array of cavities is overlapped by a corresponding piezoelectric actuator of the array of piezoelectric actuators, the array of cavities being closer to the first surface of the substrate than the second surface of the substrate; a plurality of electrical pathways extend through the substrate from the first surface to the second surface, each respective electrical pathway is coupled to the corresponding piezoelectric actuator of the array of piezoelectric actuators; and a plurality of first contacts at the second surface of the substrate, each respective first contact of the plurality of first contacts is coupled to a corresponding electrical pathway of the plurality of electrical pathways.

The device may further include: an ASIC assembly coupled to the transducer assembly, the ASIC assembly including a plurality of second contacts; and a plurality of solder structures coupling the plurality of first contacts to the plurality of second contacts.

Each respective cavity of the array of cavities may include a first dimension that extends across the respective cavity in a first direction transverse to the first surface and the second surface of the substrate; and each respective piezoelectric actuator of the array of piezoelectric actuators may include a second dimension that extends across the respective piezoelectric actuator in the first direction, and the second dimension may be less than the first dimension.

Each respective cavity of the array of cavities may include a boundary perimeter; and each respective piezoelectric actuator of the array of piezoelectric actuators may be fully within the boundary perimeter of the respective cavity of the array of cavities that corresponds to the respective piezoelectric actuator of the array of piezoelectric actuators.

Each electrical pathway of the plurality of electrical pathways is between a pair of the respective adjacent cavities of the array of cavities and a pair of respective adjacent piezoelectric actuators of the array of piezoelectric actuators.

Each electrical pathway of the plurality of electrical pathways may further include: a first portion that extends into the first surface of the substrate and that may be between an adjacent pair of the respective cavities of the array of cavities, the first portion may have a first dimension in a first direction transverse to the first surface and the second surface of the substrate; and a second portion that may be coupled to the first portion and may extend from the first portion to the second surface of the substrate, the second portion may have a second dimension that is in the first direction and may be greater than the first dimension; and the plurality of first contacts may be coupled to the second portions of the plurality of electrical pathways.

Each respective piezoelectric actuator of the array of piezoelectric actuators may have a first circular profile; and each respective cavity of the array of cavities may have a second circular profile.

The first circular profile may have a first diameter; and the second circular profile may have a second diameter that is greater than the first diameter.

Each respective cavity of the array of cavities may be spaced apart from an adjacent cavity of the array of cavities by a dimension less than 20-micrometers (μm).

Each respective cavity of the array of cavities may be spaced apart from an adjacent cavity of the array of cavities by a dimension equal to or greater than 5-micrometers (μm).

The dimension may be less than 20-micrometers (μm).

At least one embodiment of a device of the present disclosure may include: a transducer assembly including: a substrate having a first surface and a second surface opposite to the first surface; a plurality of cavities within the substrate and between the first and second surfaces of the substrate; a plurality of piezoelectric actuators on the first surface of the substrate, each respective piezoelectric actuator of the plurality of piezoelectric actuators overlaps a corresponding cavity of the plurality of cavities, and each of the respective piezoelectric actuators of the plurality of piezoelectric actuators extend from the first surface and away from the plurality of cavities; a plurality of electrical pathways extends through the substrate from the first surface to the second surface, each respective electrical pathway of the plurality of electrical pathways is coupled to a corresponding piezoelectric actuator of the plurality of piezoelectric actuators, and the piezoelectric actuators include propagation faces facing away from the first surface of the substrate and facing away from the plurality of cavities within the substrate; and a plurality of first contacts at the second surface of the substrate, each respective first contact of the plurality of first contacts is coupled to a corresponding electrical pathway of the plurality of electrical pathways.

The device may further include: an application-specific integrated circuit (ASIC) assembly including: a third surface and a fourth surface opposite to the third surface; a plurality of second contacts at the third surface and coupled to the plurality of first contacts; a plurality of solder structures couples the plurality of first contacts to the plurality of second contacts; a plurality of second electrical pathways extends through the ASIC die from the third surface to the second surface, and each respective second electrical pathway includes a contact surface exposed from the fourth surface of the ASIC die; and a plurality of ASIC die within the ASIC assembly, the plurality of ASIC die configured to provide control signals to control the plurality of piezoelectric actuators of the transducer assembly.

Each respective cavity of the plurality of cavities may be spaced apart from an adjacent cavity of the plurality of cavities by a dimension less than 20-micrometers (μm).

Each respective cavity of the plurality of cavities may be spaced apart from an adjacent cavity of the plurality of cavities by a dimension equal to or greater than 5-micrometers (μm).

The dimension may be less than 20-micrometers (μm).

At least one embodiment of a method of the present disclosure may include: forming a transducer assembly including: forming an array of cavities within a substrate and between a first surface of the substrate and a second surface of the substrate opposite to the first surface of the substrate; forming a plurality of electrical pathways extending into the first surface of the substrate to the second surface of the substrate; forming an array of piezoelectric actuators on the first surface of the substrate, forming the array of piezoelectric actuators including overlapping each respective cavity of the array of cavities within the substrate with a corresponding piezoelectric actuator of the array of piezoelectric actuators; and forming a plurality of conductive layers coupling the array of piezoelectric actuators to the plurality of electrical pathways at the first surface; coupling an application-specific integrated circuit (ASIC) assembly to the plurality of electrical pathways at the second surface of the transducer assembly.

Forming the array of cavities may further include: forming a resist layer on the first surface of the substrate with openings exposing etching regions of the first surface of the substrate from the resist layer; forming recesses extending into the first surface of the substrate by etching the substrate at the etching regions of the first surface of the substrate, and etching the substrate at the etching regions of the first surface of the substrate includes anisotropically etching the substrate at the etching regions of the first surface of the substrate; and epitaxially growing an epitaxial material within the first recess forming the array of cavities.

Forming the electrical pathways may further include: forming a first recess extending from the first surface of the substrate towards a third surface of the substrate opposite to the first surface and terminating before reaching the third surface; forming a conductive layer within the first recess; and removing a portion of the substrate at the third surface forming the second surface of the substrate and exposing the conductive layer at the second surface of the substrate.

Forming the array of electrical pathways may further include: forming a first recess extending form the first surface of the substrate towards the second surface of the substrate and terminating before reaching the second surface; forming a first conductive layer within the first recess; forming a second recess wider than the first recess extending from the second surface of the substrate towards the first surface of the substrate and terminating at the first recess; and forming a second conductive layer within the second recess.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a transducer assembly including:
  a substrate having a first surface and a second surface opposite to the first surface;
  an array of piezoelectric actuators on the first surface of the substrate;
  an array of cavities enclosed within the substrate, each respective cavity of the array of cavities is overlapped by a corresponding piezoelectric actuator of the array of piezoelectric actuators, the array of cavities being closer to the first surface of the substrate than the second surface of the substrate;
  a plurality of electrical pathways extend through the substrate from the first surface to the second surface, each respective electrical pathway is coupled to the corresponding piezoelectric actuator of the array of piezoelectric actuators; and
  a plurality of first contacts at the second surface of the substrate, each respective first contact of the plurality of first contacts is coupled to a corresponding electrical pathway of the plurality of electrical pathways.

2. The device of claim 1, further comprising:
an ASIC assembly coupled to the transducer assembly, the ASIC assembly including a plurality of second contacts; and
a plurality of solder structures coupling the plurality of first contacts to the plurality of second contacts.

3. The device of claim 1, wherein:
each respective cavity of the array of cavities includes a first dimension that extends across the respective cavity in a first direction transverse to the first surface and the second surface of the substrate; and
each respective piezoelectric actuator of the array of piezoelectric actuators includes a second dimension that extends across the respective piezoelectric actuator in the first direction, and the second dimension is less than the first dimension.

4. The device of claim 1, wherein:
each respective cavity of the array of cavities includes a boundary perimeter; and
each respective piezoelectric actuator of the array of piezoelectric actuators is fully within the boundary perimeter of the respective cavity of the array of cavities that corresponds to the respective piezoelectric actuator of the array of piezoelectric actuators.

5. The device of claim 1, wherein each electrical pathway of the plurality of electrical pathways is between a pair of the respective adjacent cavities of the array of cavities and a pair of respective adjacent piezoelectric actuators of the array of piezoelectric actuators.

6. The device of claim 1, wherein:
each electrical pathway of the plurality of electrical pathways further includes:
a first portion that extends into the first surface of the substrate and that is between an adjacent pair of the respective cavities of the array of cavities, the first portion having a first dimension in a first direction transverse to the first surface and the second surface of the substrate; and
a second portion that is coupled to the first portion and extends from the first portion to the second surface of the substrate, the second portion has a second dimension that is in the first direction and is greater than the first dimension; and
the plurality of first contacts is coupled to the second portions of the plurality of electrical pathways.

7. The device of claim 1, wherein:
each respective piezoelectric actuator of the array of piezoelectric actuators has a first circular profile; and
each respective cavity of the array of cavities has a second circular profile.

8. The device of claim 7, wherein:
the first circular profile has a first diameter; and
the second circular profile has a second diameter that is greater than the first diameter.

9. The device of claim 1, wherein each respective cavity of the array of cavities is spaced apart from an adjacent cavity of the array of cavities by a dimension less than 20-micrometers ($\mu$m).

10. The device of claim 1, wherein each respective cavity of the array of cavities is spaced apart from an adjacent cavity of the array of cavities by a dimension equal to or greater than 5-micrometers ($\mu$m).

11. The device of claim 10, wherein the dimension is less than 20-micrometers ($\mu$m).

12. A device, comprising:
a transducer assembly including:
a substrate having a first surface and a second surface opposite to the first surface;
a an array of cavities within the substrate and between the first and second surfaces of the substrate;
a an array of piezoelectric actuators on the first surface of the substrate, each respective piezoelectric actuator of the array of piezoelectric actuators overlaps a corresponding cavity of the array of cavities, and each of the respective piezoelectric actuators of the array of piezoelectric actuators extend from the first surface and away from the array of cavities;
a plurality of electrical pathways extends through the substrate from the first surface to the second surface, each respective electrical pathway of the plurality of electrical pathways is coupled to a corresponding piezoelectric actuator of the array of piezoelectric actuators, and the piezoelectric actuators include propagation faces facing away from the first surface of the substrate and facing away from the array of cavities within the substrate; and
a plurality of first contacts at the second surface of the substrate, each respective first contact of the plurality of first contacts is coupled to a corresponding electrical pathway of the plurality of electrical pathways.

13. The device of claim 12, further comprising:
an application-specific integrated circuit (ASIC) assembly including:
a third surface and a fourth surface opposite to the third surface;
a plurality of second contacts at the third surface and coupled to the plurality of first contacts;
a plurality of solder structures couples the plurality of first contacts to the plurality of second contacts;
a plurality of second electrical pathways extends through the ASIC die from the third surface to the second surface, and each respective second electrical pathway includes a contact surface exposed from the fourth surface of the ASIC die; and
a plurality of ASIC die within the ASIC assembly, the plurality of ASIC die configured to provide control signals to control the plurality of piezoelectric actuators of the transducer assembly.

14. The device of claim 12, wherein each respective cavity of the plurality of cavities is spaced apart from an adjacent cavity of the plurality of cavities by a dimension less than 20-micrometers ($\mu$m).

15. The device of claim 12, wherein each respective cavity of the plurality of cavities is spaced apart from an adjacent cavity of the plurality of cavities by a dimension equal to or greater than 5-micrometers ($\mu$m).

16. The device of claim 15, wherein the dimension is less than 20-micrometers ($\mu$m).

17. A device, comprising:
a transducer assembly including:
a substrate having a first surface and a second surface opposite to the first surface;
an array of piezoelectric actuators on the first surface of the substrate;
an array of cavities enclosed within the substrate, each respective cavity of the array of cavities is overlapped by a corresponding piezoelectric actuator of the array of piezoelectric actuators, the array of cavities being closer to the first surface than the second surface;
a plurality of electrical pathways extending through the substrate from the first surface to the second surface, each respective electrical pathway is coupled to the corresponding piezoelectric actuator of the array of piezoelectric actuators, each respective electrical pathway includes:
- a first portion with a first width and a first height;
- a second portion with a second width and a second height, the first width being greater than the first width, and the second height being greater than the first height; and a plurality of first contacts at the second surface of the substrate, each respective first contact of the plurality of first contacts is coupled to a corresponding second portion of a corresponding electrical pathway of the plurality of electrical pathways.

18. The device of claim 17, wherein the array of cavities are spaced apart from the second surface by a third height, and the third height is greater than the first height and greater than the second height.

19. The device of claim 18, wherein each respective cavity of the array of cavities includes a fourth height, and the fourth height is less than the first height.

20. The device of claim 17, wherein each respective cavity of the array of cavities overlaps at least one of respective second portion of the second portions of the plurality of electrical pathways.

* * * * *

UNITED STATES PATENT AND TRADEMARK OFFICE
CERTIFICATE OF CORRECTION

| | | |
|---|---|---|
| PATENT NO. | : 12,284,480 B2 | Page 1 of 1 |
| APPLICATION NO. | : 18/066148 | |
| DATED | : April 22, 2025 | |
| INVENTOR(S) | : Domenico Giusti et al. | |

It is certified that error appears in the above-identified patent and that said Letters Patent is hereby corrected as shown below:

In the Claims

Column 24, Claim 12, Line 5:
"a an array of" should read: --an array of--.

Column 24, Claim 12, Line 7:
"a an array of" should read: --an array of--.

Signed and Sealed this
Twenty-second Day of July, 2025

Coke Morgan Stewart
*Acting Director of the United States Patent and Trademark Office*